United States Patent
Tamura

(10) Patent No.: US 9,148,120 B2
(45) Date of Patent: Sep. 29, 2015

(54) PIEZOELECTRIC VIBRATING PIECE HAVING REDUCED RESISTANCE AND HIGH-ORDER VIBRATION SUPPRESSION

(71) Applicant: SII Crystal Technology Inc., Chiba-shi, Chiba (JP)

(72) Inventor: Masanori Tamura, Chiba (JP)

(73) Assignee: SII CRYSTAL TECHNOLOGY INC., Chiba (JP)

( * ) Notice: Subject to any disclaimer, the term of this patent is extended or adjusted under 35 U.S.C. 154(b) by 0 days.

(21) Appl. No.: 14/209,380

(22) Filed: Mar. 13, 2014

(65) Prior Publication Data

US 2014/0269220 A1 Sep. 18, 2014

(30) Foreign Application Priority Data

Mar. 15, 2013 (JP) .................................. 2013-053826

(51) Int. Cl.

| | |
|---|---|
| H01L 41/08 | (2006.01) |
| H03H 9/21 | (2006.01) |
| G04R 20/10 | (2013.01) |
| G04C 3/12 | (2006.01) |
| G04C 3/00 | (2006.01) |
| H03H 9/02 | (2006.01) |
| H03H 9/10 | (2006.01) |
| H03B 5/36 | (2006.01) |

(52) U.S. Cl.
CPC ................. *H03H 9/21* (2013.01); *G04C 3/008* (2013.01); *G04C 3/12* (2013.01); *G04R 20/10* (2013.01); *H03H 9/02157* (2013.01); *H03H 9/1014* (2013.01); *H03B 5/36* (2013.01)

(58) Field of Classification Search
CPC ....................................................... H03H 9/21
USPC ....................................................... 310/370
See application file for complete search history.

(56) References Cited

U.S. PATENT DOCUMENTS

| | | | |
|---|---|---|---|
| 7,902,729 B2 * | 3/2011 | Kawanishi et al. ........... 310/348 |
| 2014/0029179 A1 * | 1/2014 | Yamada .................... 361/679.01 |
| 2014/0078870 A1 * | 3/2014 | Kobayashi ....................... 368/47 |
| 2014/0241132 A1 * | 8/2014 | Tamura ........................... 368/47 |
| 2014/0254328 A1 * | 9/2014 | Tamura ........................... 368/47 |
| 2014/0292435 A1 * | 10/2014 | Yamada ........................ 331/158 |

FOREIGN PATENT DOCUMENTS

| | | |
|---|---|---|
| EP | 1732217 A1 | 12/2006 |
| JP | 2006-345519 A | 12/2006 |

* cited by examiner

*Primary Examiner* — Jaydi San Martin
(74) *Attorney, Agent, or Firm* — Brinks Gilson & Lione

(57) ABSTRACT

A piezoelectric vibrating piece including: a pair of vibrating arm sections which has a groove section, respectively; a base section which is disposed between the pair of vibrating arm sections; and a connecting section which connects each base end of the pair of vibrating arm sections and the base section. If a length from a base end to a leading end of the vibrating arm section in a longitudinal direction of the vibrating arm section is Lv, and a length from the base end of the vibrating arm section to an end of the connecting section on the opposite side to the vibrating arm section is Lc, a relationship of $Lc/Lv \geq 0.1$ is satisfied.

8 Claims, 11 Drawing Sheets

| No. | Lv [μm] | Lc [μm] | La [μm] | Lc/Lv [%] | La/Lv [%] | R1 [Ω] | R2 [Ω] | R2/R1 [-] |
|---|---|---|---|---|---|---|---|---|
| 0 | 820 | 80 | 350 | 9.8 | 42.7 | 13.08 | 60.16 | 4.60 |
| 1 | 820 | 50 | 300 | 6.1 | 36.6 | 20.51 | 45.94 | 2.24 |
| 2 | 820 | 50 | 400 | 6.1 | 48.8 | 14.72 | 8.24 | 0.56 |
| 3 | 820 | 50 | 500 | 6.1 | 61.0 | 11.81 | 2.99 | 0.25 |
| 4 | 820 | 100 | 300 | 12.2 | 36.6 | 14.77 | 520.33 | 35.23 |
| 5 | 820 | 100 | 400 | 12.2 | 48.8 | 10.82 | 22.36 | 2.07 |
| 6 | 820 | 100 | 500 | 12.2 | 61.0 | 8.83 | 4.88 | 0.55 |
| 7 | 820 | 200 | 300 | 24.4 | 36.6 | 14.16 | 511.37 | 36.11 |
| 8 | 820 | 200 | 400 | 24.4 | 48.8 | 10.41 | 27.54 | 2.65 |
| 9 | 820 | 200 | 500 | 24.4 | 61.0 | 8.50 | 5.34 | 0.63 |

PIEZOELECTRIC VIBRATING PIECE HAVING REDUCED RESISTANCE AND HIGH-ORDER VIBRATION SUPPRESSION

RELATED APPLICATIONS

This application claims priority under 35 U.S.C. §119 to Japanese Patent Application No. 2013-053826 filed on Mar. 15, 2013, the entire content of which is hereby incorporated by reference.

BACKGROUND OF THE INVENTION

1. Field of the Invention

The present invention relates to a piezoelectric vibrating piece, a piezoelectric vibrator, an oscillator, an electronic apparatus and a radio controlled timepiece.

2. Background Art

A piezoelectric vibrator is used in various devices as a time source, a timing source of a control signal, a reference signal source or the like. The piezoelectric vibrator has a structure in which a piezoelectric vibrating piece is accommodated in a package.

For example, as disclosed in JP-A-2006-345519, the piezoelectric vibrating piece includes a pair of vibrating arm sections, a base section provided between the pair of vibrating arm sections, and a connecting section connecting each of the pair of vibrating arm sections and the base section. If a voltage is applied to excitation electrodes formed in the vibrating arm sections, in the piezoelectric vibrating piece, the vibrating arm sections conduct bending vibration at a predetermined frequency.

In such a piezoelectric vibrating piece, power that is required for vibration is reduced in proportion as Crystal Impedance (CI) value of the piezoelectric vibrating piece is small, and it is possible to reduce the power consumption of various devices using the piezoelectric vibrating piece.

If the piezoelectric vibrating piece is expressed as an equivalent circuit, the CI value of the piezoelectric vibrating piece is often expressed as a series resistance value (hereinafter, simply referred to as a resistance value) and is also expressed as the resistance value in the specification. In the piezoelectric vibrating piece that is provided in the present situation, the resistance value is approximately 50Ω to 80Ω, for example, if an output frequency thereof is 32.768 kHz.

SUMMARY OF THE INVENTION

In the piezoelectric vibrating piece described above, if a groove section is formed in the vibrating arm section, the resistance value decreases due to an increase in electric field efficiency or the like. Generally, in the piezoelectric vibrating piece, the resistance value decreases in proportion as a length of the groove section is long. However, if the length of the groove section is a threshold or more, a resistance value of high-order vibration is smaller than that of fundamental vibration and a vibration mode is changed so that the vibration of a desired frequency cannot be obtained. In other words, it is not easy for the piezoelectric vibrating piece to reduce the resistance value while suppressing the occurrence of the high-order vibration.

An object of the invention is to provide a piezoelectric vibrating piece capable of reducing a resistance value while suppressing the occurrence of high-order vibration. Further, another object of the invention is to provide a piezoelectric vibrator, an oscillator, an electronic apparatus, and a radio controlled timepiece capable of reducing power consumption.

According to an aspect of the invention, there is provided a piezoelectric vibrating piece including: a pair of vibrating arm sections which have a groove section, respectively; a base section which is disposed between the pair of vibrating arm sections; and a connecting section which connects each base end of the pair of vibrating arm sections and the base section, in which, if a length from a base end to a leading end of the vibrating arm section in a longitudinal direction of the vibrating arm section is Lv, and a length from the base end of the vibrating arm section to an end of the connecting section on the opposite side to the vibrating arm section is Lc, a relationship of Lc/Lv≥0.1 is satisfied.

In the piezoelectric vibrating piece, the connecting section may have a convex section protruding toward the opposite side to the vibrating arm section, and the convex section may include an end of the connecting section on the opposite side to the vibrating arm section in the longitudinal direction of the vibrating arm section.

The piezoelectric vibrating piece may further include: mount electrodes for mounting a substrate, which are disposed in the base section and the connecting section, respectively.

According to another aspect of the present invention, there is provided a piezoelectric vibrator including: the piezoelectric vibrating piece according to the aspect of the invention described above; a base member on which the piezoelectric vibrating piece is mounted; and a lid member which forms a cavity in which the piezoelectric vibrating piece is accommodated with the base member.

According to still another aspect of the present invention, there is provided an oscillator including: the piezoelectric vibrator according to another aspect of the invention described above; and an integrated circuit which is electrically connected to the piezoelectric vibrator.

According to still another aspect of the present invention, there is provided an electronic apparatus including: a timer section which includes the piezoelectric vibrator according to another aspect of the invention described above.

According to still another aspect of the present invention, there is provided a radio controlled timepiece including: a filter section which includes the piezoelectric vibrator according to another aspect of the invention described above.

According to the aspect of the invention, the piezoelectric vibrating piece capable of reducing the resistance value while suppressing the occurrence of the high-order vibration is provided. Further, the object of the invention is to provide the piezoelectric vibrator, the oscillator, the electronic apparatus and the radio controlled timepiece capable of reducing power consumption.

DETAILED DESCRIPTION OF THE PREFERRED EMBODIMENTS

Figure 1:
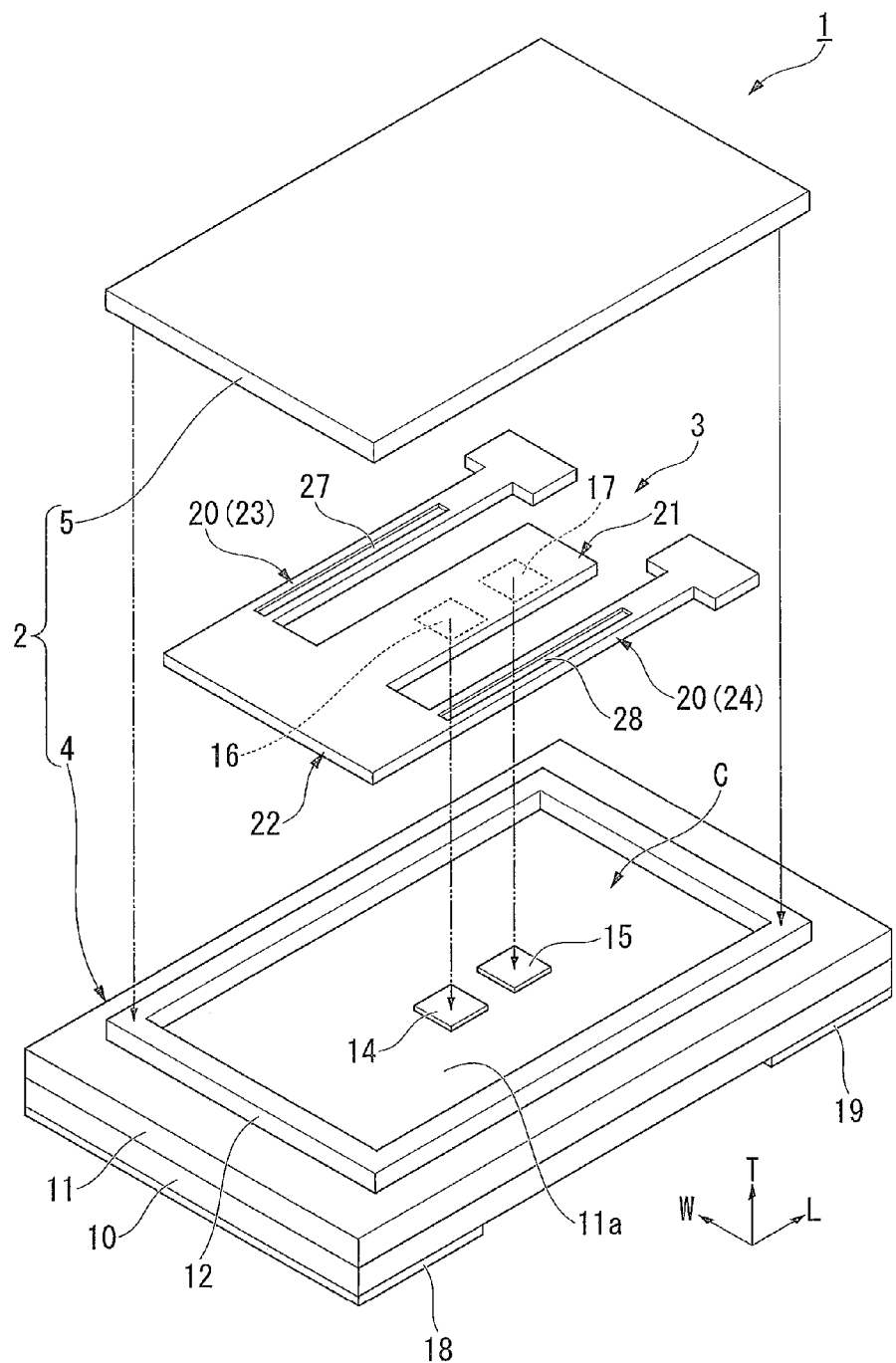
FIG. 1 is an exploded perspective view illustrating a piezoelectric vibrator of an embodiment.

Next, an embodiment will be described. FIG. 1 is an exploded perspective view illustrating a piezoelectric vibrator 1 of the embodiment. The piezoelectric vibrator 1 is a so-called surface mounting vibrator of a ceramic package type. The piezoelectric vibrator 1 includes a package 2 having a cavity C that is hermetically sealed, and a piezoelectric vibrating piece 3 accommodated in the cavity C.

The piezoelectric vibrator 1 illustrated in FIG. 1 has a substantially rectangular parallelepiped external shape. In the following description, a longitudinal direction of the piezoelectric vibrator 1 is referred to as a length direction L and a short direction of the piezoelectric vibrator 1 is referred to as a width direction W when viewed from a thickness direction T of the piezoelectric vibrating piece 3.

The package 2 includes a package body (a base section) 4 and a sealing plate (a lid member) 5. The package body 4 is a member having a concave section with a bottom. The sealing plate 5 blocks an opening of the concave section of the package body 4 and is bonded to the package body 4. The cavity C is an inner space corresponding to an inside of the concave section of the package body 4 and is separated from the outside of the package 2 by the package body 4 and the sealing plate 5.

The package body 4 includes a first base substrate 10, a second base substrate 11 disposed on the first base substrate 10 and a seal ring 12 disposed on the second base substrate 11.

The first base substrate 10 and the second base substrate 11 are plate members, respectively, in which external shapes thereof are substantially rectangular, when viewed from the thickness direction T. An external dimension of the second base substrate 11 viewed from the thickness direction T is substantially the same as that of the first base substrate 10.

The first base substrate 10 and the second base substrate 11 are made of ceramic, respectively. For example, a forming material of the first base substrate 10 and the second base substrate 11 may be High Temperature Co-Fired Ceramic (HTCC) mainly composed of alumina or may be Low Temperature Co-Fired Ceramic (LTCC) such as glass ceramic.

The second base substrate 11 is superimposed on the first base substrate 10 and is joined with the first base substrate 10 by sintering or the like. That is, the second base substrate 11 is integrated with the first base substrate 10. In the second base substrate 11, a surface facing the opposite side to the first base substrate 10 corresponds to a bottom surface of the concave section of the package body 4 and is a mounting surface 11a on which the piezoelectric vibrating piece 3 is mounted.

The seal ring 12 is a frame-shaped member and includes side walls of the concave section of the package body 4. An external dimension of the seal ring 12 viewed from the thickness direction T is slightly smaller than that of the second base substrate 11. The seal ring 12 is bonded to the mounting surface 11a by baking using a brazing material such as silver brazing, a solder material or the like. The seal ring 12 may be bonded to the mounting surface 11a by welding or the like to a metal bond layer which is formed on the mounting surface 11a. The metal bond layer may be formed by using at least one of electroplating, electroless plating, vapor depositing and sputtering.

The seal ring 12 is a conductive material and, for example, includes nickel-based alloys. The nickel-based alloys may include one or two or more of Kovar, Elinvar, Invar, and 42-Alloy. A forming material of the seal ring 12 may be selected from a material having a coefficient of thermal expansion similar to that of the first base substrate 10 and the second base substrate 11. For example, as the forming material of the first base substrate 10 and the second base substrate 11, if alumina having the coefficient of thermal expansion of $6.8 \times 10^{-6}/°C$. is used, Kovar having the coefficient of thermal expansion of $5.2 \times 10^{-6}/°C$. or 42-Alloy having the coefficient of thermal expansion of 4.5 to $6.5 \times 10^{-6}/°C$. may be used as the forming material of the seal ring 12.

The sealing plate 5 is superimposed on the seal ring 12 and blocks the opening of the seal ring 12. The cavity C described above is a space surrounded by the second base substrate 11, the seal ring 12 and the sealing plate 5. That is, the piezoelectric vibrating piece 3 is accommodated inside the seal ring 12 when viewed from the thickness direction T.

The sealing plate 5 is a conductive substrate and is bonded to the seal ring 12. For example, the seal ring 12 is bonded to the sealing plate 5 by welding such as seam welding by contact with a roller electrode, laser welding and ultrasonic welding. In a case where the sealing plate 5 and the seal ring 12 are welded together, if bonding layers of nickel, gold and the like are formed on one or both of a lower surface of the sealing plate 5 and an upper surface of the seal ring 12, reliability of the bonding by welding is improved and, for example, airtightness of the cavity C is easily ensured.

An electrode pad 14 and an electrode pad 15 are provided on the mounting surface 11a of the second base substrate 11 inside the seal ring 12. The electrode pad 14 and the electrode pad 15 are a pair of terminals electrically connected to the piezoelectric vibrating piece 3. A mount electrode 16 and a mount electrode 17 for mounting the substrate are provided in the piezoelectric vibrating piece 3 and detailed description thereof is given below. The electrode pad 14 is electrically connected to the mount electrode 16 of the piezoelectric vibrating piece 3 and the electrode pad 15 is electrically connected to the mount electrode 17 of the piezoelectric vibrating piece 3.

An external electrode 18 and an external electrode 19 are provided on a lower surface of the first base substrate 10. The external electrode 18 and the external electrode 19 are terminals which receive power supply from an external device of the piezoelectric vibrator 1, for example, a device on which the piezoelectric vibrator 1 is mounted.

A first wiring (not illustrated) electrically connecting the electrode pad 14 and the external electrode 18, and a second wiring (not illustrated) electrically connecting the electrode pad 15 and the external electrode 19 are provided in the package body 4. That is, an electric potential applied to the external electrode 18 is applied to the mount electrode 16 of the piezoelectric vibrating piece 3 through the first wiring and the electrode pad 14. Further, an electric potential applied to the external electrode 19 is applied to the mount electrode 17 of the piezoelectric vibrating piece 3 through the second wiring and the electrode pad 15. The piezoelectric vibrating piece 3 is vibrated by power which is supplied to the mount electrode 16 and the mount electrode 17.

Moreover, for example, the first wiring includes a first penetration electrode which is electrically connected to the external electrode 18 by passing through the first base substrate 10 in the thickness direction T, a second penetration electrode which is electrically connected to the electrode pad 14 by passing through the second base substrate 11 in the thickness direction T, and a connection wiring which is provided between the first base substrate 10 and the second base substrate 11 and electrically connecting the first penetration electrode and the second penetration electrode. The second wiring electrically connecting the electrode pad 15 and the external electrode 19 is configured similar to the first wiring. Configurations of the first wiring and the second wiring can be appropriately changed.

Next, the piezoelectric vibrating piece 3 is described. The piezoelectric vibrating piece 3 is a plate part as illustrated in FIG. 1. In the piezoelectric vibrating piece 3, an associated object such as a conductive film pattern serving as wiring or an electrode is formed in a piezoelectric body such as crystal, lithium tantalate or lithium niobate.

Figure 2:
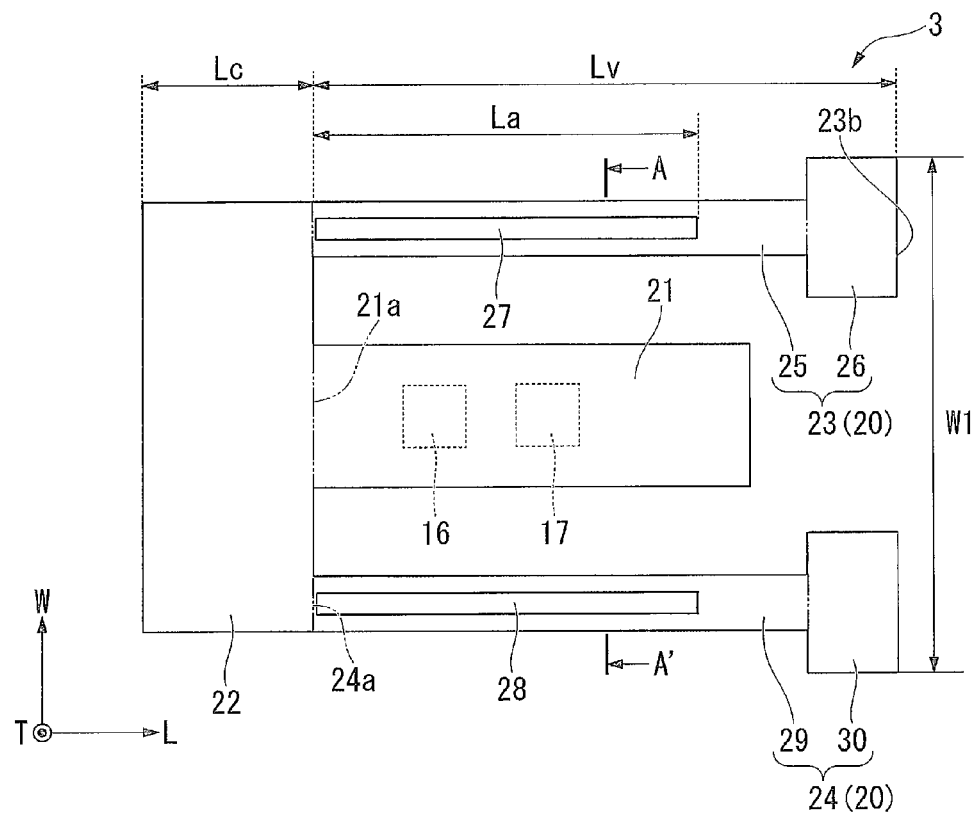
FIG. 2 is a plan view of a piezoelectric vibrating piece of the embodiment viewed from a thickness direction.

FIG. 2 is a plan view of the piezoelectric vibrating piece 3 of the embodiment viewed from the thickness direction T. In the embodiment, a surface of external surfaces of the piezoelectric vibrating piece 3 which is orthogonal to the thickness direction T is referred to as a main surface. That is, the main surface of the piezoelectric vibrating piece 3 is a surface parallel to each of the length direction L and the width direction W.

The piezoelectric vibrating piece 3 includes a pair of vibrating arm sections 20, a base section 21 that is disposed between the pair of vibrating arm sections 20, and a connecting section 22 that connects the pair of vibrating arm sections 20 and the base section 21. In the embodiment, the pair of vibrating arm sections 20, the base section 21 and the connecting section 22 are integrally formed, and all adjacent sections are continuous with each other without interface. In FIG. 2, in order to indicate a range of each section, a base end or a leading end of each section is indicated by a two-dot chain line.

In the embodiment, an external shape of the base section 21 is rectangular, viewed from the thickness direction T and the longitudinal direction thereof is substantially parallel to the length direction L. An end of the base section 21 on a −L side in the length direction L is a base end 21*a* and the base section 21 linearly extends on a +L side. The base section 21 is continuous with the connecting section 22 in the base end 21*a* thereof.

The base section 21 includes a mount section which is mounted on the package 2 of the piezoelectric vibrator 1 illustrated in FIG. 1. The base section 21 of the embodiment includes the mount electrode 16 and the mount electrode 17, and each of the mount electrode 16 and the mount electrode 17 is the mount section.

The mount electrode 16 is electrically connected to the electrode pad 14 illustrated in FIG. 1. For example, the electrode pad 14 is a bump electrode and the mount electrode 16 is electrically connected to the electrode pad 14 by contact with the electrode pad 14 with a conductive adhesive interposed therebetween. The mount electrode 17 is electrically connected to the electrode pad 15, similar to the mount electrode 16.

Moreover, the mount electrode 16 may directly come into contact with the electrode pad 14 without the conductive adhesive interposed therebetween. In addition, the electrical connection between the mount electrode 16 and the electrode pad 14 may be performed by using a connection method other than the bump electrode.

The pair of vibrating arm sections 20 include a vibrating arm section 23 and a vibrating arm section 24. An end of the vibrating arm section 23 on the −L side in the length direction L is a base end 23*a* and the vibrating arm section 23 linearly extends on the +L side. The vibrating arm section 23 is continuous with the connecting section 22 in the base end 23*a* thereof and is supported to the connecting section 22 in a cantilever manner. The longitudinal direction of the vibrating arm section 23 is substantially parallel to the length direction L and is substantially parallel to the longitudinal direction of the base section 21.

The length Lv of the vibrating arm section 23 is a length from the base end 23*a* to a leading end 23*b* of the vibrating arm section 23 in the longitudinal direction (the length direction L) of the vibrating arm section 23. If an external size of the piezoelectric vibrator 1 in the length direction L is approximately 1 mm, the length Lv of the vibrating arm section 23 is, for example, approximately 800 μm. The length of the vibrating arm section 24 in the length direction L is substantially the same as that of the vibrating arm section 23 and a difference between the length of the vibrating arm section 24 and the length Lv of the vibrating arm section 23 is within manufacturing tolerances.

The vibrating arm section 23 includes a strip-shaped section 25 linearly extending with a uniform width and a hammer section 26 of which a width (a dimension in the width direction W) with respect to the longitudinal direction of the strip-shaped section 25 is wider than that of the strip-shaped section 25. An end of the strip-shaped section 25 on the −L side corresponds to the base end 23*a* of the vibrating arm section 23 and is continuous with the connecting section 22. An end of the strip-shaped section 25 on the +L side is continuous with the hammer section 26.

A groove section 27 is formed in the strip-shaped section 25 of the vibrating arm section 23. The groove section 27 extends substantially parallel to the longitudinal direction (the length direction L) of the vibrating arm section 23. The groove section 27 is formed in the main surface of the piezoelectric vibrating piece 3 and a depth direction thereof is substantially parallel to the thickness direction T of the piezoelectric vibrating piece 3. The length La of the groove section 27 is a length from one end to the other end of the groove section 27 in the length direction of the vibrating arm section 23.

The vibrating arm section 24 is disposed symmetrically with the vibrating arm section 23 with respect to a center line of the base section 21 in the width direction W. The shape and the dimension of the vibrating arm section 24 are substantially the same as those of the vibrating arm section 23. Thus, repeated description of the vibrating arm section 23 is simplified or omitted in the description of the vibrating arm section 24.

An end of the vibrating arm section 24 on the −L side in the length direction L is a base end 24a and the vibrating arm section 24 linearly extends on the +L side. The vibrating arm section 24 is connected to the connecting section 22 in the base end 24a thereof and is supported to the connecting section 22 in a cantilever manner. The vibrating arm section 24 includes a strip-shaped section 29 in which a groove section 28 is formed, and a hammer section 30.

Moreover, a sign W1 in FIG. 2 is the maximum width of the piezoelectric vibrating piece 3. The maximum width W1 in FIG. 2 is a distance from an end of the hammer section 26 of the vibrating arm section 23 on a +W side to an end of the hammer section 30 of the vibrating arm section 24 on a −W side. For example, if an external size of the piezoelectric vibrator 1 illustrated in FIG. 1 in the width direction W is approximately 800 μm, the maximum width W1 of the piezoelectric vibrating piece 3 is approximately 400 μm.

The connecting section 22 is continuous with the base end 21a of the base section 21 and is continuous with the base end 23a of the vibrating arm section 23. That is, the connecting section 22 is continuous between the base end 21a of the base section 21 and the base end 23a of the vibrating arm section 23, and connects the base end 21a of the base section 21 and the base end 23a of the vibrating arm section 23. Similarly, the connecting section 22 connects the base end 21a of the base section 21 and the base end 24a of the vibrating arm section 24.

The connecting section 22 illustrated in FIG. 2 extends in a direction (the width direction W) crossing the longitudinal direction of the base section 21. An external shape of the connecting section 22 viewed from the thickness direction of the piezoelectric vibrating piece 3 is rectangular. The base end 23a of the vibrating arm section 23 is disposed in an end section of the connecting section 22 on the +W side and the base end 24a of the vibrating arm section 24 is disposed in an end section of the connecting section 22 on the −W side. The base end 21a of the base section 21 is disposed in a range (a center portion of the piezoelectric vibrating piece 3 in the width direction W) including a center position between the base end 23a of the vibrating arm section 23 and the base end 24a of the vibrating arm section 24.

The length Lc of the connecting section 22 is a length from the base end 23a of the vibrating arm section 23 to an end of the connecting section 22 on the opposite side to the vibrating arm section 23 in the longitudinal direction of the vibrating arm section 23. In other words, the length Lc of the connecting section 22 is a distance between the end of the connecting section 22 in the normal direction of a reference surface and the reference surface in which a surface including the base end 23a of the vibrating arm section 23 and the base end 24a of the vibrating arm section 24 is the reference surface.

Figure 3:
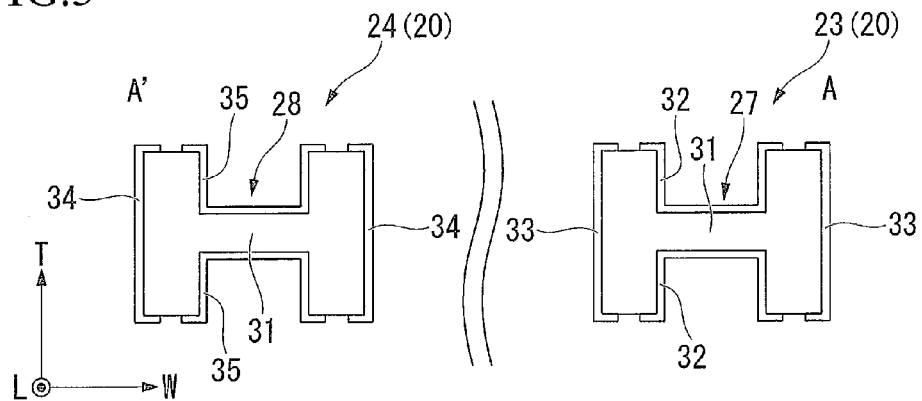
FIG. 3 is a cross-sectional view of a pair of vibrating arm sections in a position of line A-A' of FIG. 2.

FIG. 3 is a cross-sectional view of the pair of vibrating arm sections 20 in a position of line A-A' of FIG. 2. The vibrating arm section 23 includes a piezoelectric body 31, an excitation electrode 32 and an excitation electrode 33. The excitation electrode 32 is continuous with a surface of the piezoelectric body 31 in the groove section 27 and a surface of the piezoelectric body 31 around the groove section 27. The excitation electrode 33 is formed discontinuously with the excitation electrode 32 and is insulated from the excitation electrode 32. In the piezoelectric body 31, the excitation electrode 33 is continuous with a part of a surface on the same side as the main surface of the piezoelectric vibrating piece 3 and a surface (a side surface) facing the side with respect to the main surface of the piezoelectric vibrating piece 3.

The excitation electrode 32 is electrically connected to the mount electrode 16 of the base section 21 through wiring provided in the connecting section 22 and the base section 21. That is, the excitation electrode 32 is electrically connected to the external electrode 18 illustrated in FIG. 1. The excitation electrode 33 is electrically connected to the mount electrode 17 of the base section 21 through wiring provided in the connecting section 22 and the base section 21. That is, the excitation electrode 33 is electrically connected to the external electrode 19 illustrated in FIG. 1. The excitation electrode 32 and the excitation electrode 33 apply an electric field to the piezoelectric body 31 in the vibrating arm section 23 by receiving power supplied from the external electrode 18 and the external electrode 19. If the electric field is applied from the excitation electrode 32 and the excitation electrode 33 to the piezoelectric body 31, the vibrating arm section 23 vibrates in a direction separating from and a direction approaching the base section 21 starting from the base end 23a (see FIG. 2).

The vibrating arm section 24 includes the piezoelectric body 31, an excitation electrode 34 and an excitation electrode 35. The excitation electrode 34 is formed in a position corresponding to the excitation electrode 33 in the vibrating arm section 23. The excitation electrode 34 is electrically connected to the mount electrode 16 of the base section 21 through wiring provided in the connecting section 22 and the base section 21. The excitation electrode 35 is formed in a position corresponding to the excitation electrode 32 in the vibrating arm section 23. The excitation electrode 35 is electrically connected to the mount electrode 17 of the base section 21 through wiring (not illustrated) provided in the connecting section 22 and the base section 21. Similar to the vibrating arm section 23, the electric field is applied from the excitation electrode 32 and the excitation electrode 33 to the piezoelectric body 31 in the vibrating arm section 24 by receiving power supplied from the external electrode 18 and the external electrode 19, and the vibrating arm section 24 vibrates in the direction separating from and the direction approaching the base section 21 starting from the base end 24a (see FIG. 2).

Moreover, in the connecting section 22, the position of the base end 23a of the vibrating arm section 23 or a portion in the vicinity thereof may vibrate with the vibrating arm section 23, but amplitude thereof is sufficiently smaller than that of the vibrating arm section 23. That is, the base end 23a of the vibrating arm section 23 corresponds to a position of a node of a fundamental wave of the vibrating arm section 23 which vibrates or a position in the vicinity thereof.

In the piezoelectric vibrating piece 3 described above, since the groove section is formed in each of the pair of vibrating arm sections 20, electric field efficiency becomes higher and then the resistance value decreases. Now, the resistance value decreases in proportion as the length of the groove section is long but if the length of the groove section is a threshold or more, a resistance value of the high-order vibration is smaller than that of a fundamental vibration. As a result, the piezoelectric vibrating piece vibrates with the high-order vibration and the vibration in a desired frequency is not obtained.

In the piezoelectric vibrating piece 3 of the embodiment, since the connecting section 22 satisfies predetermined conditions, it is possible to reduce the resistance value while suppressing the occurrence of the high-order vibration. Hereinafter, vibration characteristics of the piezoelectric vibrating piece 3 are described in detail with reference to examples and comparative examples.

Figures 4, 5:
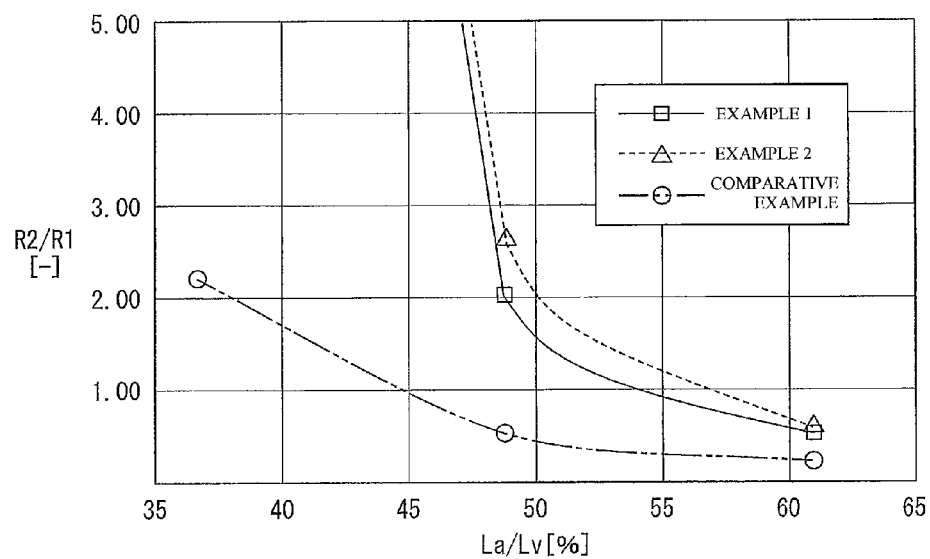
FIG. 4 is a table illustrating each of resistance values of a plurality of piezoelectric vibrating pieces in which combinations of a length Lv of a vibrating arm section, a length Lc of a connecting section and a length La of a groove section are different from each other.
FIG. 5 is a graph plotting a ratio (R2/R1) of a resistance value R2 of secondary vibration to a resistance value R1 of primary vibration with respect to a relative length (La/Lv) of the groove section.

FIG. 4 is a table 1 illustrating each of the resistance values of the plurality of piezoelectric vibrating pieces in which combinations of the length Lv of the vibrating arm section 23, the length Lc of the connecting section 22 and the length La of the groove section 27 are different from each other. FIG. 5 is a graph plotting a ratio (R2/R1) of a resistance value R2 of a secondary vibration to a resistance value R1 of a primary vibration with respect to a relative length (La/Lv) of the groove section for the piezoelectric vibrating pieces of the examples and the comparative examples. For the length Lv of the vibrating arm section 23, the length Lc of the connecting section 22 and the length La of the groove section 27, see FIG. 2 and the description thereof.

Data of ten samples indicated by No. 0 to No. 9 is illustrated in the table 1. In all of the ten samples, each length Lv of the vibrating arm section 23 and the vibrating arm section 24 is 820 μm. No. 1 to No. 3 are data of the comparative examples and correspond to a plot of Comparative Example 1 of FIG. 5. No. 4 to No. 9 are data of the examples. No. 4 to No. 6 correspond to Example 1 of FIG. 5, and No. 7 to No. 9 correspond to Example 2 of FIG. 5.

For all of No. 1 to No. 3, the length Lc of the connecting section is 50 μm and Lc/Lv is approximately 6.1%. For the length La of the groove section in No. 1 to No. 3, No. 1 is the shortest and the length becomes longer in order, that is, No. 1 is 300 μm, No. 2 is 400 μm, and No. 3 is 500 μm. Moreover, for the resistance value R1 of the primary vibration, No. 1 is approximately 20.51Ω, No. 2 is approximately 14.72Ω and No. 3 is approximately 11.81Ω. As described above, generally, the resistance value R1 of the primary vibration decreases in proportion as the length La of the groove section is long.

Meanwhile, for the resistance value R2 of the secondary vibration, No. 1 is approximately 45.94Ω, No. 2 is approximately 8.24Ω and No. 3 is 2.99Ω. As described above, the resistance value R2 of the secondary vibration also decreases in proportion as the length La of the groove section is long. When lengthening the groove section, the decrease in the resistance value R2 of the secondary vibration is more remarkable than the decrease in the resistance value R1 of the primary vibration, and R2/R1 decreases in proportion as the length La of the groove section is long.

In Comparative Example 1 of FIG. 5, if La/Lv is approximately 45%, R2/R1 is less than 1 and it is presumed that the piezoelectric vibrating piece vibrates in the secondary vibration if La/Lv is 45% or more. Since the resistance value R1 of No. 2 of FIG. 4 is approximately 15Ω, it is presumed that the resistance value R1 exceeds 15Ω if La/Lv is 45%. As described above, in Comparative Example 1, in order to vibrate the piezoelectric vibrating piece in the primary vibration, La/Lv is less than 45% and it is difficult to make the resistance value R1 less than 15Ω.

For all of No. 4 to No. 6 to which the piezoelectric vibrating piece of the embodiment is applied, the length Lc of the connecting section 22 is 100 μm and Lc/Lv is approximately 12.2%. For the length La of groove section 27 in No. 4 to No. 6, No. 4 is the shortest and the length becomes longer in order, that is, No. 4 is 300 μm, No. 5 is 400 μm, and No. 6 is 500 μm. Moreover, for the resistance value R1 of the primary vibration, No. 4 is approximately 14.77Ω, No. 5 is approximately 10.82Ω and No. 6 is approximately 8.83Ω. For the resistance value R2 of the secondary vibration, No. 4 is approximately 520.33Ω, No. 5 is approximately 22.36Ω and No. 6 is approximately 4.88Ω.

In Example 1 of FIG. 5, if La/Lv is approximately 53.9%, R2/R1 is 1. Thus, in Example 1, it is presumed that the piezoelectric vibrating piece 3 vibrates in the primary vibration if the length La of the groove section is less than 53.9% of the length of the vibrating arm section 23. That is, in Example 1, since Lc/Lv is 0.1 or more, it is possible to make the length La of the groove section longer than that of Comparative Example 1 under conditions that the piezoelectric vibrating piece 3 vibrates in the primary vibration. In No. 5 of FIG. 4, since La/Lv is approximately 48.8% and the resistance value R1 of the primary vibration is approximately 10.82Ω, in Example 1, it is presumed that the resistance value R1 of the primary vibration can be reduced to approximately 10Ω while suppressing the occurrence of the secondary vibration. As described above, it is possible to make the resistance value R1 of the primary vibration 15Ω or less while suppressing the occurrence of the secondary vibration by satisfying 0.49≤La/Lv≤0.53.

For all of No. 7 to No. 9 to which the piezoelectric vibrating piece of the embodiment is applied, the length Lc of the connecting section 22 is 200 μm and Lc/Lv is approximately 24.4%. For the length La of groove section 27 of No. 7 to No. 9, No. 7 is the shortest and the length becomes longer in order, that is, No. 7 is 300 μm, No. 8 is 400 μm, and No. 9 is 500 μm. Moreover, for the resistance value R1 of the primary vibration, No. 7 is approximately 14.16Ω, No. 8 is approximately 10.41Ω and No. 9 is approximately 8.83Ω. For the resistance value R2 of the secondary vibration, No. 7 is approximately 511.37Ω, No. 8 is approximately 27.54Ω and No. 9 is approximately 5.34Ω.

In Example 2 of FIG. 5, if La/Lv is approximately 57.0%, R2/R1 is 1. Thus, in Example 2, it is presumed that the piezoelectric vibrating piece 3 vibrates in the primary vibration if the length La of the groove section is less than 57.0% of the length of the vibrating arm section 23. That is, in Example 2, since Lc/Lv is 0.1 or more, it is possible to make the length La of the groove section longer than that of Comparative Example 1 under conditions that the piezoelectric vibrating piece 3 vibrates in the primary vibration. In No. 5 of FIG. 4, La/Lv is approximately 48.8% and the resistance value R1 of the primary vibration is approximately 10.41Ω. However, it is possible to suppress the occurrence of the secondary vibration even if La/Lv is greater than that of No. 5 in a range of 57.0% or less. Therefore, in Example 2, it is presumed that the resistance value R1 of the primary vibration can be reduced to approximately 10Ω.

Now, for the sample of No. 0 of FIG. 4, the length Lc of the connecting section 22 is 80 μm, Lc/Lv is approximately 9.8%, the length of the groove section 27 is 350 μm and La/Lv is approximately 42.7%. In the sample, Lc/Lv is slightly less than 10% and R2/R1 exceeds 1, and the occurrence of secondary vibration is suppressed. From this, it is presumed that the occurrence of the secondary vibration can be sufficiently suppressed if Lc/Lv is 10% or more. Further, for the sample of No. 0, since the resistance value R1 of the primary vibration is approximately 13.08Ω, it is presumed that the resistance value R1 of the primary vibration can sufficiently be 15Ω or less if Lc/Lv is 10% or more.

Here, attention is paid to the maximum value (hereinafter, referred to as an upper limit length of the groove section) of the length La of the groove section under conditions that the piezoelectric vibrating piece vibrates in the primary vibration. The upper limit length of the groove section of Example 1 (approximately 54%) is longer than that of Comparative Example 1 (approximately 45%) and Example 2 is longer than Example 1 (approximately 57%). Further, for any La/Lv in FIG. 5, when comparing R2/R1 of Example 1, Example 2 and Comparative Example, a difference between Example 1 and Example 2 is smaller than that between Comparative Example 1 and Example 1. From this, it is presumed that a rate of increase in the upper limit length of the groove section with respect to a rate of increase in Lc/Lv decreases in proportion as Lc/Lv is large. Thus, Lc/Lv may be 0.25 or less, may be 0.2 or less and may be 0.15 or less. It is possible to decrease the external dimension of the piezoelectric vibrating piece 3 by making Lc/Lv the threshold or less.

As described above, since the piezoelectric vibrating piece 3 according to the embodiment satisfies a relationship that the length Lv of the vibrating arm section 23 and the length Lc of the connecting section 22 is Lc/Lv≥0.1, it is possible to reduce R1 while satisfying a relationship of R2/R1<1. Factors thereof are not completely clear but, for example, the following factors are conceivable.

The primary vibration is vibration in which the base end 23a of the vibrating arm section 23 is a node and amplitude thereof is the maximum in the leading end (the hammer section 26) of the vibrating arm section 23. The secondary vibration is the same as the primary vibration in that the base end 23a of the vibrating arm section 23 is the node, but is different from the primary vibration in that an antinode of the vibration exists in the strip-shaped section 25, that is, between the base end 23a and the leading end of the vibrating arm section 23. Thus, in the secondary vibration, the base end 23a of the vibrating arm section 23 is not displaced in theory but it is presumed that a bending stress which is greater than that of the primary vibration is acted on the connecting section 22 by bending the vibrating arm section 23. The bending stress acts so that the connecting section 22 is bent in the surface including the length direction L and the width direction W. In a case where the resistance value R2 of the secondary vibration is approximately the same order as the resistance value R1 of the primary vibration, if the length Lc of the connecting section 22 is lengthened, it is conceivable that rigidity of the connecting section 22 increases with respect to the bending stress and, as a result, the resistance value R2 of the secondary vibration increases.

As described above, in the piezoelectric vibrating piece 3 according to the embodiment, it is possible to reduce the resistance value R1 of the primary vibration while suppressing the occurrence of the secondary vibration. Thus, it is possible to vibrate the piezoelectric vibrating piece 3 in a desired frequency and it is possible to reduce power which is required to vibrate. As a result, the piezoelectric vibrator 1 including the piezoelectric vibrating piece 3 is capable of outputting a desired frequency and, moreover, capable of being operated with low power consumption.

Moreover, the shape of the piezoelectric vibrating piece 3 is not limited to the aspect of FIG. 2. Hereinafter, modification examples of the piezoelectric vibrating piece 3 according to the embodiment will be described with reference to FIGS. 6 to 11.

Figure 6:
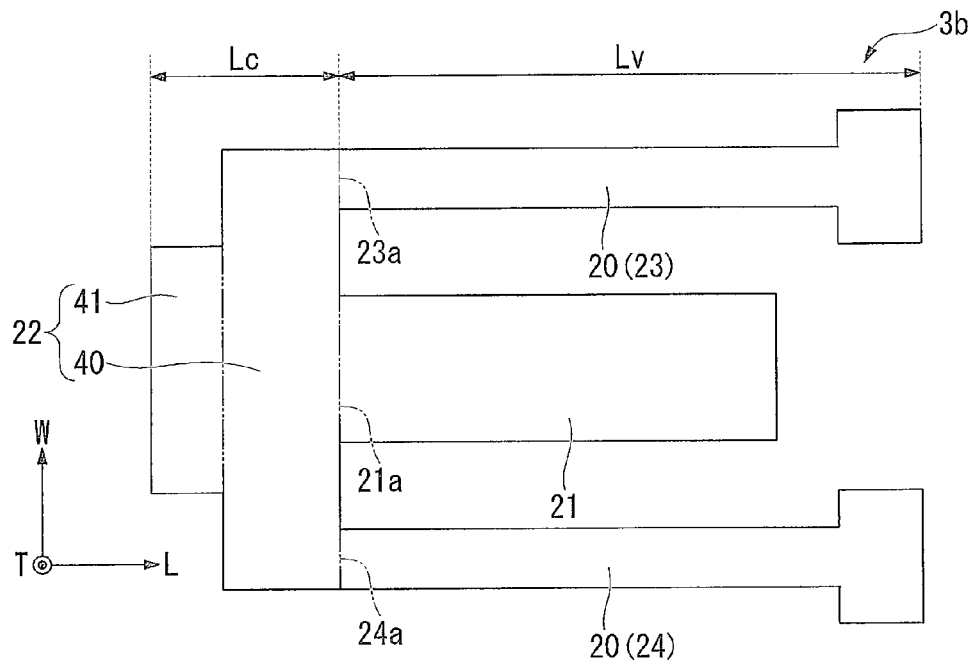
FIG. 6 is a view illustrating a piezoelectric vibrating piece according to Modification Example 1.

FIG. 6 is a view illustrating a piezoelectric vibrating piece 3b according to Modification Example 1. In the piezoelectric vibrating piece 3b, the connecting section 22 includes a body section 40 which is continuous with the base section 21, and a convex section 41 that is disposed on the opposite side to the base section 21 with respect to the body section 40.

The body section 40 is rectangular when viewed from the thickness direction T. The vibrating arm section 23 is continuous with an end section of the body section 40 on the +W side in the width direction W and the vibrating arm section 24 is continuous with an end section of the body section 40 on the −W side. The body section 40 has end surfaces 40a facing the opposite side to the vibrating arm section 23 in opposite ends in the width direction W, respectively. In the modification example, the end surfaces 40a are planar.

The convex section 41 protrudes on the opposite side (on the −L side in the length direction) to the vibrating arm section 23. The dimension of the convex section 41 in the width direction W is smaller than that of the body section 40 and is continuous with the center portion of the body section 40 in the width direction W. The convex section 41 has an end surface 41a facing the opposite side to the vibrating arm section 23 with respect to the body section 40. In the modification example, the end surface 41a is planar. The end surface 41a is substantially parallel to the end surfaces 40a of the body section 40 of the connecting section 22 and has a step between the end surfaces 40a. The end surface 41a includes an end that is farthest, of the connecting section 22, from the base end 23a of the vibrating arm section 23 in the longitudinal direction (the length direction L) of the vibrating arm section 23. In the modification example, the length Lc of the connecting section 22 is a distance between the end surface 41a of the convex section 41 of the connecting section 22 and the base end 23a of the vibrating arm section 23 in the length direction L.

Figure 7:
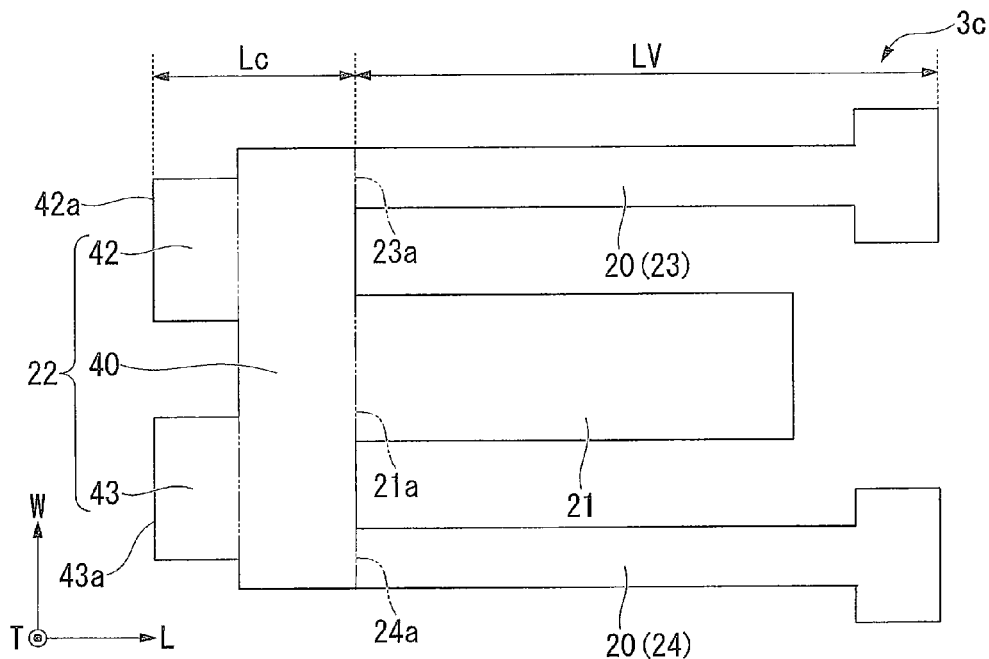
FIG. 7 is a view illustrating a piezoelectric vibrating piece according to Modification Example 2.

FIG. 7 is a view illustrating a piezoelectric vibrating piece 3c according to Modification Example 2. The piezoelectric vibrating piece 3c is different from that of Modification Example 1 in that the connecting section 22 includes a plurality of convex sections (a convex section 42 and a convex section 43). A gap exists between the convex section 42 and the convex section 43 in the width direction W. The convex section 43 is disposed symmetrically with the convex section 42 with respect to the center of the connecting section 22 in the width direction W. In the modification example, the convex section 43 has substantially the same dimension as that of the convex section 42. The convex section 42 has an end surface 42a facing the opposite side to the vibrating arm section 23 with respect to the body section 40 of the connecting section 22. Similarly, the convex section 43 has an end surface 43a facing the opposite side to the vibrating arm section 24 with respect to the body section 40 of the connecting section 22. The end surface 42a and the end surface 43a are planar, respectively, and are disposed on the same plane (which is flush).

In the modification example, the length Lc of the connecting section 22 is a distance between the end surface 42a of the convex section 42 of the connecting section 22 and the base end 23a of the vibrating arm section 23 in the length direction L, and, in the modification example, is the same as a distance between the end surface 43a of the convex section 43 of the connecting section 22 and the base end 24a of the vibrating arm section 24.

Moreover, in the length direction L, the position (coordinate) of the end surface 43a of the convex section 43 may be different from the position of the end surface 42a of the convex section 42. For example, in a case where one or both of the piezoelectric body 31 (see FIG. 3) of the piezoelectric vibrating piece 3c and the associated object thereof is asymmetrical with respect to a center line of the piezoelectric vibrating piece 3c in the width direction W, since the shape or the dimension of the convex section 43 is different from that of the convex section 42, it may take a balance of a weight, balance of vibration characteristics or the like. In such a case, as the length Lc of the connecting section 22, it may adapt a value whichever is longer in the distance between the end surface 42a of the convex section 42 and the base end 23a of the vibrating arm section 23 in the length direction L, and in the distance between the end surface 43a of the convex section 43 and the base end 24a of the vibrating arm section 24 in the length direction L.

Figure 8:
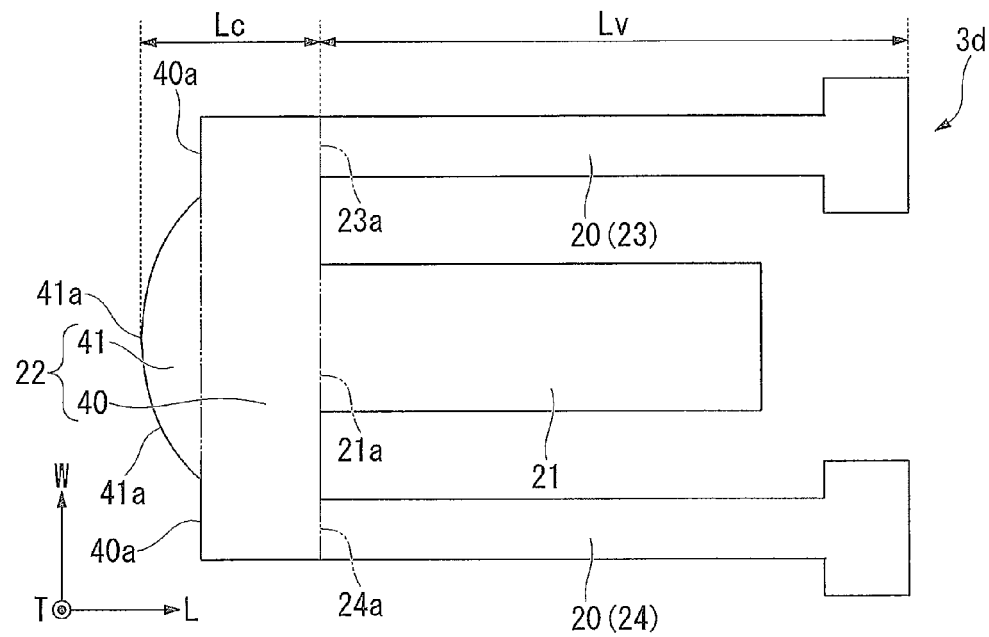
FIG. 8 is a view illustrating a piezoelectric vibrating piece according to Modification Example 3.

FIG. 8 is a view illustrating a piezoelectric vibrating piece 3d according to Modification Example 3. The piezoelectric vibrating piece 3d is different from that of Modification Example 1 in that the end surface 41a of the convex section 41 of the connecting section 22 is bent. In FIG. 8, an end surface 41a of the convex section 41 on the most −L side in the length direction L is a portion of the center of the convex section 41 in the width direction W. In the modification example, the length Lc of the connecting section 22 is a distance between the end surface 41a of the convex section 41 of the connecting section 22 and the base end 23a of the vibrating arm section 23 in the length direction L.

In the piezoelectric vibrating piece of Modification Examples 1 to 3 described above, it is possible to reduce the resistance value while suppressing the occurrence of the high-order vibration by satisfying the relationship that the length Lv of the vibrating arm section 23 and the length Lc of the connecting section 22 is Lc/Lv≥0.1. Since the piezoelectric vibrating piece of Modification Examples 1 to 3 corresponds to a state where a part of the connecting section 22 is cut when compared to the piezoelectric vibrating piece 3 of FIG. 2 under the conditions that the lengths Lc of the connecting section 22 are the same as each other, it is possible to reduce the weight thereof. Furthermore, since the piezoelectric vibrating piece of Modification Examples 1 to 3 has a wide gap with the package 2 illustrated in FIG. 1 in corner portions of the connecting section 22, it is difficult to interface with the package 2 and, for example, it is possible to increase workability when mounting the piezoelectric vibrating piece in the package 2.

Figure 9:
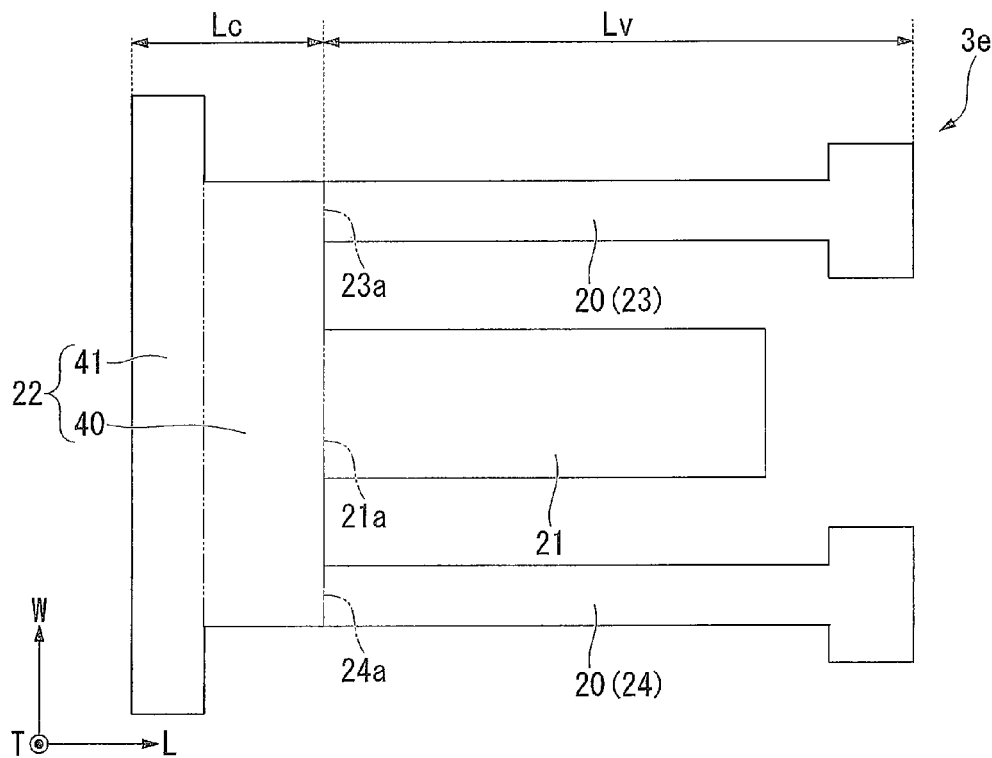
FIG. 9 is a view illustrating a piezoelectric vibrating piece according to Modification Example 4.

FIG. 9 is a view illustrating a piezoelectric vibrating piece 3e according to Modification Example 4. In the piezoelectric vibrating piece 3e, the dimension of the convex section 41 of the connecting section 22 in the width direction W is greater than that of the body section 40. The convex section 41 has the end surface 41a facing the opposite side to the vibrating arm section 23 with respect to the body section 40 of the connecting section 22. In the modification example, the length Lc of the connecting section 22 is a distance between the end surface 41a of the convex section 41 of the connecting section 22 and the base end 23a of the vibrating arm section 23 in the length direction L. In the piezoelectric vibrating piece 3e, it is possible to suppress the occurrence of the high-order vibration while reducing the resistance value by satisfying the relationship that the length Lv of the vibrating arm section 23 and the length Lc of the connecting section 22 is Lc/Lv≥0.1.

Figure 10:
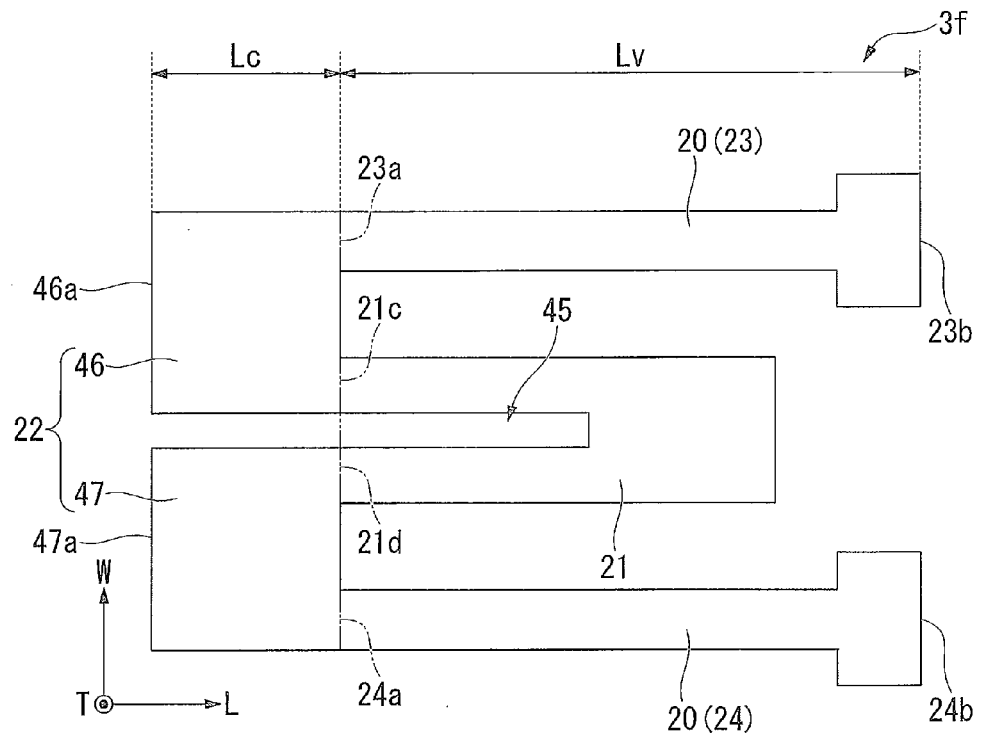
FIG. 10 is a view illustrating a piezoelectric vibrating piece according to Modification Example 5.

FIG. 10 is a view illustrating a piezoelectric vibrating piece 3f according to Modification Example 5. The base section 21 in the piezoelectric vibrating piece 3f is substantially C-shape and has a slit 45 extending in the length direction L. The base section 21 has a base end 21c and a base end 21d which are disposed through the slit 45 in the longitudinal direction (the length direction L) of the vibrating arm section 23. The position of the base end 21c is substantially the same as the position of the base end 23a of the vibrating arm section 23 in the longitudinal direction (the length direction L) of the vibrating arm section 23. Further, the position of the base end 21d is substantially the same as the position of the base end 21c and is substantially the same as the position of the base end 24a of the vibrating arm section 24 in the longitudinal direction (the length direction L) of the vibrating arm section 23.

In the modification example, the connecting section 22 includes a first connecting section 46 connecting the base end 21c of the base section 21 and the base end 23a of the vibrating arm section 23, and a second connecting section 47 connecting the base end 21d of the base section 21 and the base end 24a of the vibrating arm section 24. The first connecting section 46 has an end surface 46a facing the opposite side to the leading end 23b of the vibrating arm section 23 with respect to the base end 23a of the vibrating arm section 23. Similarly, the second connecting section 47 has an end surface 47a facing the opposite side to the leading end 24b of the vibrating arm section 24 with respect to the base end 24a of the vibrating arm section 24. The position of the end surface 47a of the second connecting section 47 in the longitudinal direction (the length direction L) of the vibrating arm section 23 is substantially the same as that of the end surface 46a of the first connecting section 46.

In the comparative example, the length Lc of the connecting section 22 is a distance between the end surface 46a of the first connecting section 46 and the base end 23a of the vibrating arm section 23 in the length direction L, and, in the modification example, is also the same as a distance between the end surface 47a of the second connecting section 47 of the connecting section 22 and the base end 24a of the vibrating arm section 24.

In the piezoelectric vibrating piece 3f of the modification examples, it is possible to suppress the occurrence of the high-order vibration while reducing the resistance value by satisfying the relationship that the length Lv of the vibrating arm section 23 and the length Lc of the connecting section 22 is Lc/Lv≥0.1. Further, in the piezoelectric vibrating piece 3f, it is possible to reduce the weight thereof by providing the slit 45.

Figure 11:
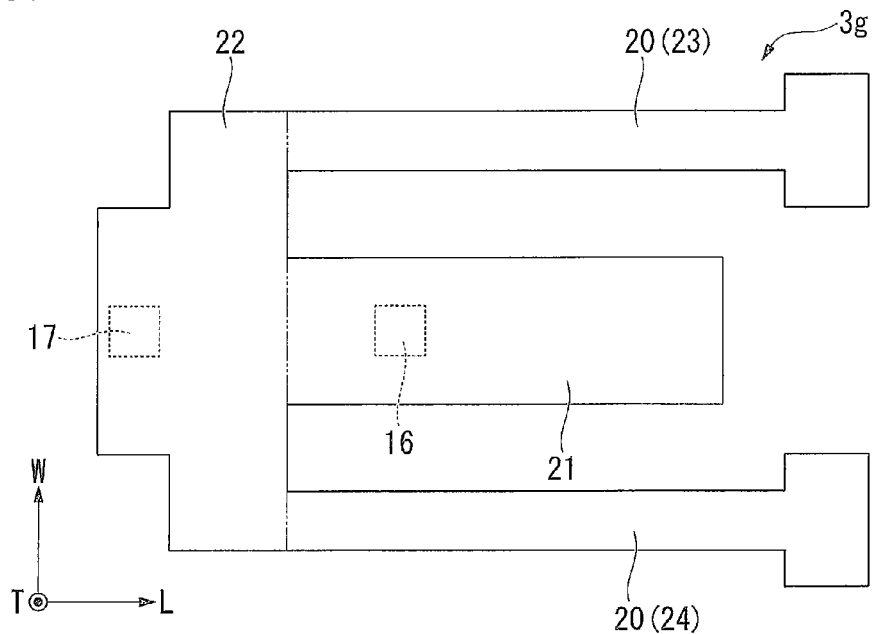
FIG. 11 is a view illustrating a piezoelectric vibrating piece according to Modification Example 6.

FIG. 11 is a view illustrating a piezoelectric vibrating piece 3g according to Modification Example 6. In the piezoelectric vibrating piece 3g, the mount electrode 16 is provided in the base section 21 and the mount electrode 17 is provided in the connecting section 22. In the piezoelectric vibrating piece 3g of the modification example, a distance between the mount electrode 16 and the mount electrode 17 is easily enlarged in the length direction L. Thus, it is possible to support the piezoelectric vibrating piece 3g in a state where opposite ends of the piezoelectric vibrating piece 3g are nearly supported, when compared to a case where all of a pair of mount electrodes are disposed in the base section 21. Thus, it is possible to increase workability when mounting the piezoelectric vibrating piece 3g. Further, if the piezoelectric vibrator 1 receives impact or the like from outside, it is possible to suppress that the piezoelectric vibrating piece 3g is inclined from a desired posture and collides with the inner surface of the package 2.

Figure 12:
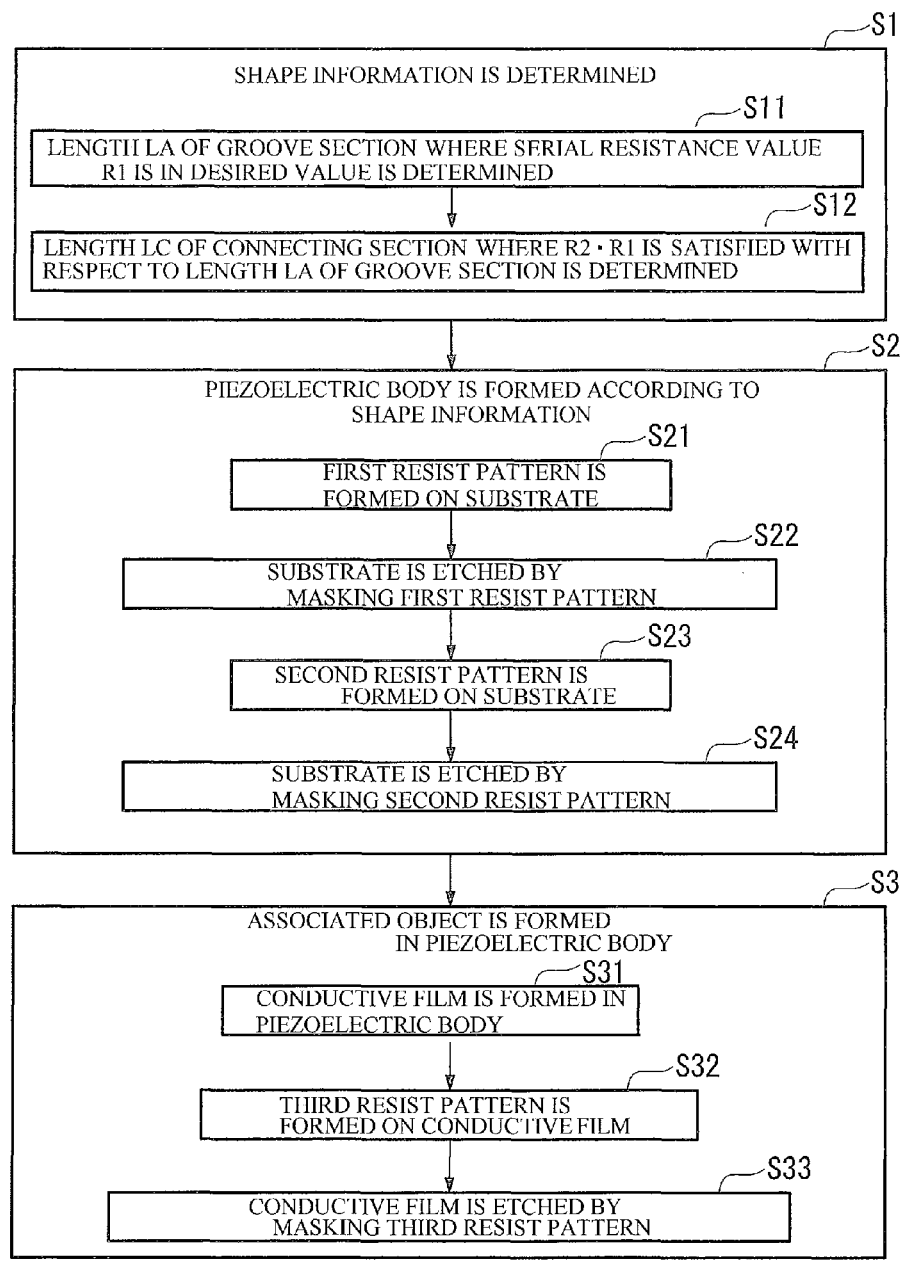
FIG. 12 is a flowchart illustrating a manufacturing method of a piezoelectric vibrating piece.

Next, a manufacturing method of the piezoelectric vibrating piece will be described. FIG. 12 is a flowchart illustrating the manufacturing method of the piezoelectric vibrating piece. The manufacturing method is a manufacturing method of the piezoelectric vibrating piece including a pair of vibrating arm sections having groove sections, respectively, a base section that is disposed between the pair of vibrating arm sections, and a connecting section that connects each base end of the pair of vibrating arm sections and the base section.

The manufacturing method of the piezoelectric vibrating piece includes a first step (step S1) for determining shape information indicating the shape of the piezoelectric vibrating piece, a second step (step S2) for forming the piezoelectric body to a shape indicated by the shape information which is determined in the first step, and a third step (step S3) for forming the associated object including a conductive film pattern in the piezoelectric body which is formed in the second step.

The shape information includes length information from the base end to the leading end of the vibrating arm section in the longitudinal direction of the vibrating arm section, information indicating the length of the groove section, and information indicating the length from the base end of the vibrating arm section to the end of the opposite side to the vibrating arm section in the connecting section.

The first step (step S1) for determining the shape information includes a first process (step S11) for determining the length of the groove section where the resistance value R1 of the primary vibration of the piezoelectric vibrating piece is within a range of a target value, and a second process (step S12) for determining the length of the connecting section with respect to the length of the groove section which is determined in the first process where the resistance value R2 of the secondary vibration of the piezoelectric vibrating piece is greater than the resistance value R1.

The first step will be described below in detail, but first, the second step and the third step are described. In the second step and the third step, a wafer for multiple chamfering is the substrate and various structures of the piezoelectric vibrating piece 3 are formed in each of a plurality of chip regions on the substrate. Then, a plurality of piezoelectric vibrating pieces 3 are manufactured by individualizing (dicing) each of the chip regions of the substrate.

In the second step, the piezoelectric body 31 of the piezoelectric vibrating piece 3 is molded through step S21 and step S22. In step S21, a first resist film is formed by covering the substrate made of a piezoelectric material. Then, a pattern of a first photomask is transferred to the first resist film by exposure using the first photomask or the like where the pattern depending on the external shape of the piezoelectric body 31 of the piezoelectric vibrating piece 3 is formed. Then, a first resist pattern is formed depending on the external shape of the piezoelectric body 31 of the piezoelectric vibrating piece 3 by developing the exposed first resist film. The first resist pattern is formed in a region of the regions on the substrate, which corresponds to an inside of an outline of the piezoelectric vibrating piece 3 when viewed from the thickness direction T. In step S22, the substrate is etched by masking the first resist pattern formed in step S21, and the first resist pattern is peeled after etching. Therefore, the piezoelectric body 31 having a desired external shape is formed.

The pattern which is transferred in step S21 includes a portion corresponding to the base section 21, a portion corresponding to the vibrating arm section 23 and a portion corresponding to the connecting section 22, and a dimension of each portion of the pattern is set according to the shape information which is determined in the first step. For example, a length of the portion of the pattern, which corresponds to the connecting section 22 is set to a dimension depending on the length Lc of the connecting section 22 which is determined in step S12 and magnification when transferring the pattern.

In the second step, the groove sections (the groove section 27 and the groove section 28) are formed in the piezoelectric body 31 through step S23 and step S24 continuous with step S22. In step S23, a second resist film is formed by covering the piezoelectric body 31 formed in step S22. Then, a pattern of a second photomask is transferred to the second resist film by exposure using the second photomask or the like where the pattern depending on the groove section of the piezoelectric vibrating piece 3 is formed. Then, a second resist pattern depending on the groove section of the piezoelectric vibrating piece 3 is formed by developing the exposed second resist film. The second resist pattern is formed in a region of the piezoelectric body 31, which covers a portion except for the groove section. In step S24, the piezoelectric body 31 is etched by masking the second resist pattern formed in step S23. Then, the second resist pattern is peeled. Therefore, the groove section having a desired dimension and shape is formed in a desired position on the piezoelectric body 31.

The pattern which is transferred in step S23 includes a portion corresponding to the groove section, and the dimension of the portion is set according to the shape information which is determined in the first step. For example, a length of the portion of the pattern which corresponds to the groove section is set to a dimension depending on the length La of the groove section determined in step S11 and magnitude when transferring the pattern.

In the third step, the associated object such as a conductive film pattern is formed in the piezoelectric body 31 which is obtained through the second step described above. The conductive film pattern includes wirings electrically connecting the mount electrode and the excitation electrode, and the mount electrode and the excitation electrode of the piezoelectric vibrating piece 3.

In the third step, in step S31, for example, a conductive material is deposited by sputtering and vapor depositing or the like by covering the piezoelectric body 31 which is obtained through the second step, and the conductive film is formed. In step S32, a third resist film is formed on the conductive film which is formed in step S31. Then, a pattern of a third photomask is transferred to the third resist film by exposure using the third photomask or the like where the pattern depending on the conductive film pattern of the piezoelectric vibrating piece 3 is formed. Then, a third resist pattern is formed depending on the conductive film pattern of the piezoelectric vibrating piece 3 by developing the exposed third resist film. The third resist pattern is formed in a region of the piezoelectric body 31, except for the region where the conductive film pattern is formed. In step S33, the conductive film is etched by masking the third resist pattern formed in step S32. Thus, the third resist pattern is peeled. Therefore, the conductive film pattern having a desired dimension and shape is formed in a desired position on the piezoelectric body 31. Then, the piezoelectric vibrating piece 3 is obtained by individualizing the substrate (wafer) through the second step and the third step.

Figure 13:
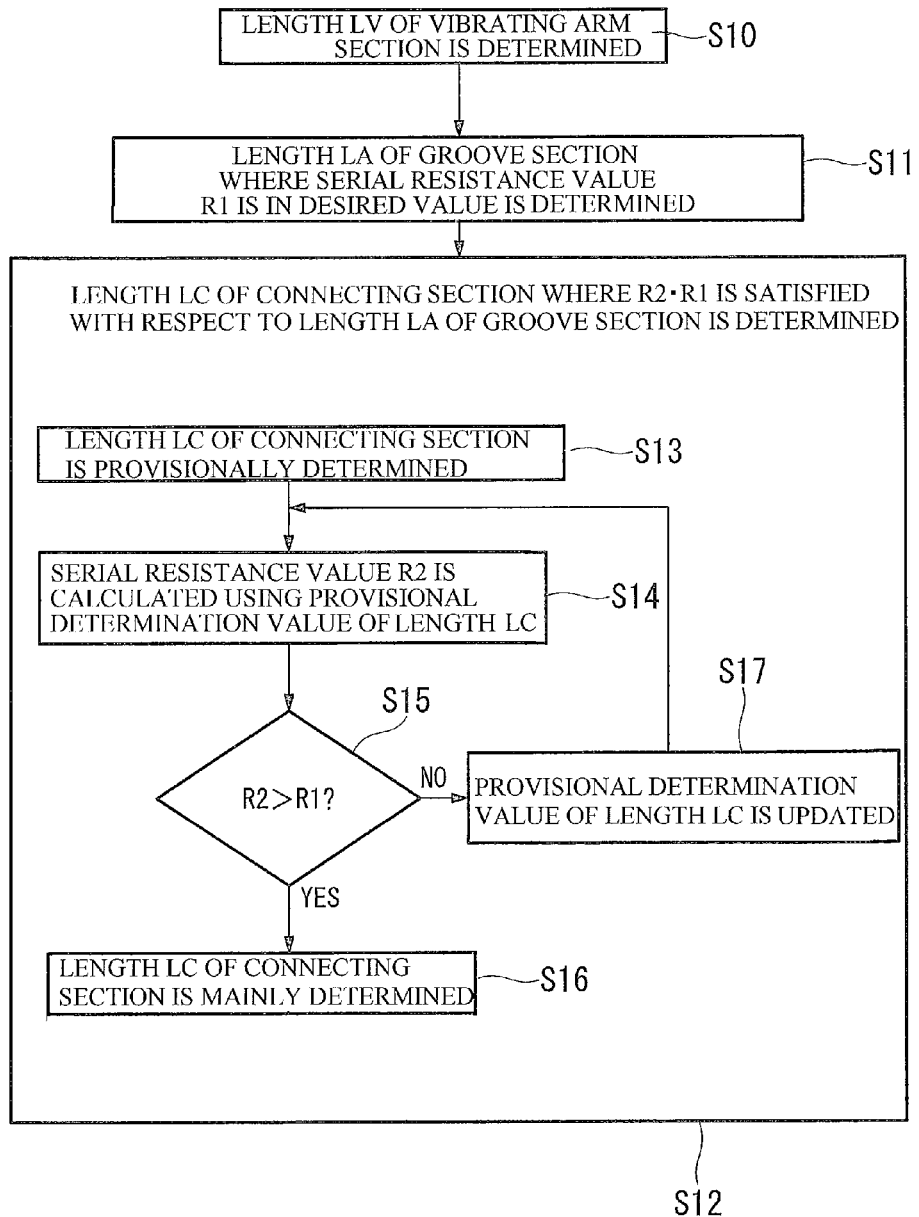
FIG. 13 is a flowchart illustrating steps of determining shape information of the piezoelectric vibrating piece.

Next, the first step (step S1) will be described in detail with reference to an example. FIG. 13 is a flowchart illustrating steps determining the shape information of the piezoelectric vibrating piece.

In the embodiment, in the first step, first, the length Lv of the vibrating arm section is determined (step S10). The length Lv of the vibrating arm section is determined to be a value where the vibration frequency of the piezoelectric vibrating piece 3 is a target value, based on physical properties of the piezoelectric body 31. The target value of the vibration frequency of the piezoelectric vibrating piece 3 is determined depending on usage or the like of the piezoelectric vibrator 1 and, for example, is mostly set to 32.768 kHz in the piezoelectric vibrator which is used for measuring time or the like.

In the first process (step S11) of the first step, the length La and the depth of the groove section are determined, based on the length Lv of the vibrating arm section. In step S11, the length La of the groove section where the resistance value R1 is in the range of the target value is determined. The target value of the resistance value R1 is a value which is selected from a range of 10Ω or more to 15Ω or less.

As illustrated in FIGS. 4 and 5, the resistance value R1 of the primary vibration of the piezoelectric vibrating piece is a function of La/Lv and the length La of the groove section where the resistance value R1 is in the range of the target value is obtained by using a numeral simulation or the like. For example, first, the resistance value R1 is calculated by the numeral simulation while systemically changing the length La of the groove section. Then, the resistance value R1 is expressed as the function of the length La of the groove section by using a plurality of data obtained by the numeral simulation. Then, the length La of the groove section where the resistance value R1 is in the range of the target value is calculated in the function, and the calculated value is determined as the length La of the groove section.

In the second process (step S12) of the first step, the length Lc of the connecting section 22, which satisfies conditions that the resistance value R2 of the secondary vibration is greater than the resistance value R1 of the primary vibration, is determined with respect to the length La of the groove section that is determined in the first process of step S11. It is possible to obtain the length Lc of the connecting section satisfying the conditions described above, for example, by using the numeral simulation or the like.

Here, an example of a method for determining the length Lc of the connecting section is described. In the example, a tentative value (hereinafter, referred to as a provisional determination value) of the length Lc of the connecting section is provisionally determined (step S13). Next, the resistance value R2 of the secondary vibration depending on the provisional determination value of the length Lc is calculated using the numeral simulation or the like (step S14). The provisional determination value of the length Lc is a value that is arbitrarily selected and, for example, may be set to 10% (Lc/Lv=0.1) of the length Lv of the vibrating arm section 23.

Next, a magnitude relationship between the resistance value R2 of the secondary vibration and the resistance value R1 of the primary vibration calculated using the provisional determination value of the length Lc is compared to each other (step S15). The resistance value R1 of the primary vibration that is used in the comparison in step S15 may be calculated in step S15 and may be the target value of the resistance value R1 of the primary vibration that is used for determining the length La of the groove section in step S11.

In a comparison result in step S15, if the resistance value R2 of the secondary vibration is greater than the resistance value R1 of the primary vibration (step S15; Yes), the provisional determination value of the length Lc is mainly determined as the length Lc of the connecting section 22 (step S16). In the comparison result in step S15, if the resistance value R2 of the secondary vibration is less than the resistance value R1 of the primary vibration (step S15; No), the provisional determination value of the length Lc is updated (step S17).

As illustrated in FIGS. 4 and 5, the resistance value R2 of the secondary vibration of the piezoelectric vibrating piece is a function of Lc/Lv and is on the increase with respect to an increase in Lc/Lv. Thus, in step S17, the provisional determination value of the length Lc may be updated to a further increased value.

Following step S17, the resistance value R2 of the secondary vibration is calculated in step S14 using the provisional determination value of the length Lc that is updated and then the resistance value R2 of the secondary vibration that is calculated is compared to the resistance value R1 of the primary vibration in step S15. Hereinafter, similarly, the process of step S14, step S15 and step S17 is appropriately repeated until the resistance value R2 of the secondary vibration is greater than the resistance value R1 of the primary vibration. In this way, the length Lc of the connecting section satisfying the conditions that the resistance value R2 of the secondary vibration is greater than the resistance value R1 of the primary vibration is obtained.

However, in a method for manufacturing a typical piezoelectric vibrating piece, the length La of the groove section in which the secondary vibration does not occur may be determined depending on the length Lv of the vibrating arm section and the length Lc of the connecting section, after the length Lv of the vibrating arm section and the length Lc of the connecting section are determined. In such a manufacturing method, since an upper limit value of the length of the groove section is restricted by the length of the connecting section, the length of the groove section cannot be lengthened to a value where the resistance value of the primary vibration is lowered to a desired value. For example, in Comparative Example 1 illustrated in FIG. 5, in a state where Lc/Lv is set to 6.1% in advance, it is assumed that the length La of the groove section in which the secondary vibration does not occur is determined. In this case, the length La of the groove section in which the secondary vibration does not occur is selected from a range where R2/R1 is less than 1, that is, a range where La/Lv is less than 45%. Thus, if the length La of the groove section is approximately 45% of the length Lv of the vibrating arm section, the resistance value of the primary vibration is a lower limit value and the lower limit value may be greater than a desired range (for example, 15Ω or less).

In the method for manufacturing the piezoelectric vibrating piece described above, the length La of the groove section where the resistance value R1 of the primary vibration is the desired value is determined, and the length Lc of the connecting section satisfying the conditions that the resistance value R2 of the secondary vibration is greater than the resistance value R1 of the primary vibration is determined with respect to the length La of the determined groove section. Thus, it is possible to decrease the resistance value R1 to the desired value while suppressing the occurrence of the secondary vibration. As a result, according to the manufacturing method, it is possible to manufacture the piezoelectric vibrating piece in which the resistance value R1 can be decreased while suppressing the occurrence of the secondary vibration.

Moreover, if an initial value of the provisional determination value is set to 10% or more of the length Lv of the vibrating arm section (that is, Lc/Lv≥0.1), in a result of the calculating step, it is presumed that the resistance value R2 of the secondary vibration is greater than the resistance value R1 of the primary vibration. Thus, it is possible to omit step S17 and the calculating step involved in changing of the provisional determination value (step S14), or to reduce the number of calculating steps involved in the changing of the provisional determination value.

Moreover, in step S15 described above, if the resistance value R2 of the secondary vibration is greater than the resistance value R1 of the primary vibration (step S15; Yes), step S14 may be performed by updating the provisional determination value of the length Lc to a further decreased value. In this case, step S16 may include processing that determines a value (for example, the minimum value), which is relatively small in the provisional determination values of the length Lc satisfying the conditions that the resistance value R2 of the secondary vibration of the piezoelectric vibrating piece is greater than the resistance value R1 of the primary vibration, to the length Lc of the connecting section. In this way, it is possible to reduce the piezoelectric vibrating piece in size by determining the length Lc of the connecting section to the value that is a relatively small value in a plurality of provisional determination values of the length Lc satisfying the conditions. In this case, in step S13, the provisional determination values of the length Lc may be set to values (for example, 15%, 20% and 25%) which are sufficiently greater than 10% of the length Lv of the vibrating arm section.

Moreover, in the example described above, the resistance value is calculated by the numeral simulation but may be a value which is measured by experiments or the like using samples. Further, in the first process S11, a numeral table indicating a relationship between the length La of the groove section and the resistance value R1 is prepared in advance and the length La of the groove section where the resistance value R1 is within the range of the target value may be obtained by referring to the numerical table. Similarly, in the second process S12, a numeral table indicating a relationship between the length Lc of the connecting section and the resistance value R2 is prepared in advance and the length Lc of the connecting section where the resistance value R2 is greater than the resistance value R1 may be determined by referring to the numerical table.

Figure 14:
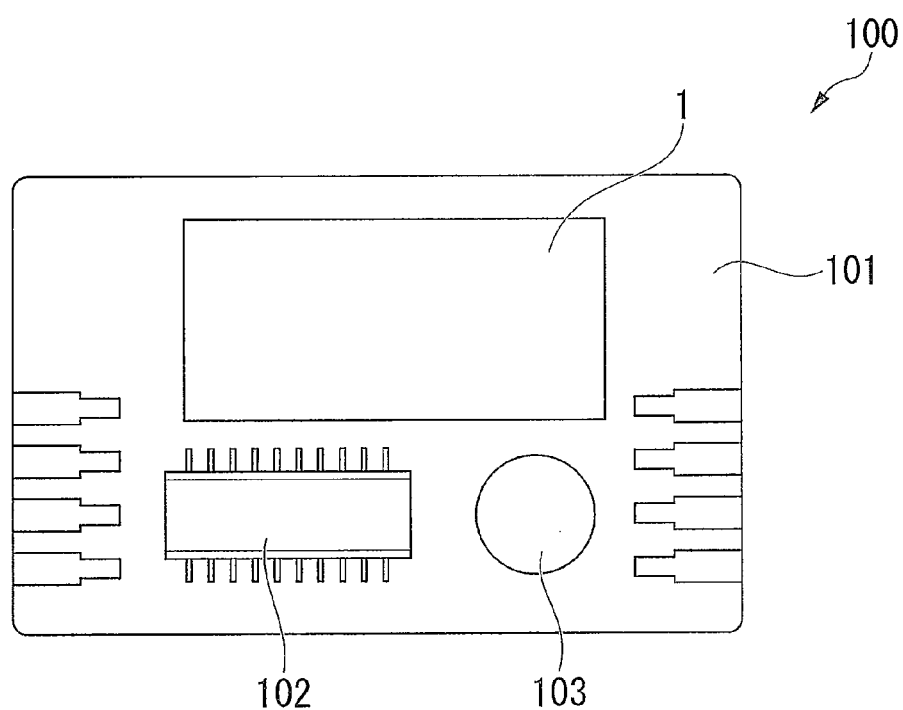
FIG. 14 is a view illustrating an oscillator of an embodiment.

Next, an oscillator according to an embodiment is described. FIG. 14 is a view illustrating an oscillator 100 of the embodiment. The oscillator 100 includes a substrate 101, an integrated circuit 102, an electronic part 103 and the piezoelectric vibrator 1. For example, the electronic part 103 is a capacitor or the like and is mounted on the substrate 101. The integrated circuit 102 is used for the oscillator and is mounted on the substrate 101. The integrated circuit 102 is electrically connected to the electronic part 103 and the piezoelectric vibrator 1, respectively, through wirings (not illustrated). For example, the piezoelectric vibrator 1 is mounted in the vicinity of the integrated circuit 102 in the substrate 101. The piezoelectric vibrator 1 is the piezoelectric vibrator of the embodiment described with reference to FIG. 1 or the like and functions as the oscillator. At least a part of the oscillator 100 may be appropriately molded by resin (not illustrated).

In the oscillator 100, if power is supplied to the piezoelectric vibrator 1, the piezoelectric vibrating piece of the piezoelectric vibrator 1 vibrates. The vibration of the piezoelectric vibrating piece is converted into an electric signal by piezoelectric characteristics of the piezoelectric vibrating piece. The electric signal is output from the piezoelectric vibrator 1 to the integrated circuit 102. The integrated circuit 102 generates a frequency signal by executing various types of processing with the electric signal output from the piezoelectric vibrator 1.

For example, the oscillator 100 can be applied to a single-function oscillator for a clock, a timing control apparatus for controlling an operation timing of various apparatuses such as a computer, an apparatus for supplying time or calendar, or the like. The integrated circuit 102 is configured depending on functions required for the oscillator 100 and may include a so-called real time clock (RTC) module.

Since the oscillator 100 of the embodiment includes the piezoelectric vibrator 1 in which occurrence of vibration failure is suppressed, it is possible to realize a stable operation with low power consumption.

Next, a portable information apparatus is described as one form of the electronic apparatus according to the embodiment. The portable information apparatus is a form of a wristwatch and is significantly smaller and more lightweight than a typical cellular phone, but is capable of communication similar as the cellular phone. In the portable information apparatus, a display section such as a liquid crystal display or the like is arranged in a portion corresponding to a dial, and time information or the like can be displayed on the display section. Further, in the portable information apparatus, input and output sections such as a speaker and a microphone are provided in a portion inside a band, and making a call or the like is possible with the input and output sections.

Figure 15:
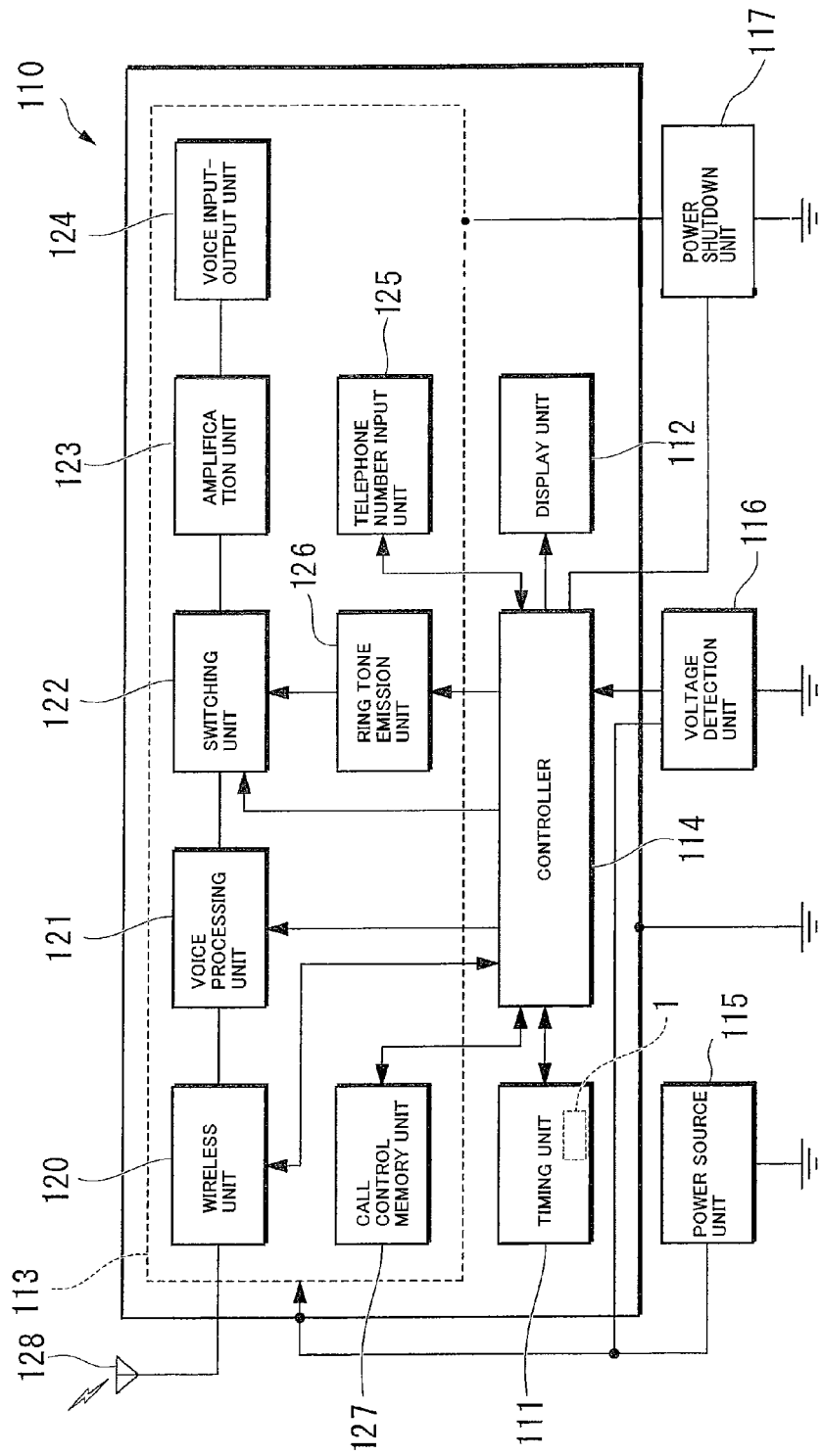
FIG. 15 is a view illustrating an example of a portable information apparatus of an embodiment.

FIG. 15 is a view illustrating an example of a portable information apparatus 110 of an embodiment. The portable information apparatus 110 illustrated in FIG. 15 includes a timer section 111, a display section 112, a communication section 113, a controller 114, a power supply section 115, a voltage detecting section 116 and a power shutdown section 117.

The controller 114 performs overall control of each section of the portable information apparatus 110. For example, the controller 114 controls measurement of time by the timer section 111, display of the information by the display section 112, communication with the outside by the communication section 113 or the like. For example, the controller 114 includes a ROM in which a program is written in advance, a CPU that reads the program written in the ROM and executes various types of processing according to the program, and a RAM that is used as a work area of the CPU.

The timer section 111 includes an integrated circuit and the piezoelectric vibrator 1. The integrated circuit includes an oscillator circuit, a register circuit, a counter circuit and an interface circuit. The piezoelectric vibrator 1 is the piezoelectric vibrator according to the embodiment described with reference to FIG. 1. In the piezoelectric vibrator 1, the piezoelectric vibrating piece vibrates by receiving the power supply and the vibration is converted into an electric signal according to the piezoelectric characteristics of the piezoelectric vibrating piece. The electric signal output from the piezoelectric vibrator 1 is input into the oscillator circuit of the integrated circuit.

In the integrated circuit of the timer section 111, the output of the oscillator circuit is binarized and is counted by the register circuit and the counter circuit. A count result is supplied to the controller 114 through the interface circuit. The controller 114 calculates time, date or the like by executing various computations, based on the counting result from the integrated circuit, and displays various types of information such as time, date and calendar on the display section 112, based on the calculating result.

The communication section 113 performs communication with the outside, that is, transmits data to the outside and receives data from the outside. The communication section 113 includes a radio section 120, a voice processing section 121, a switching section 122, an amplifier 123, a voice input and output section 124, a phone number input section 125, a ring sound generator 126, and a call control memory section 127.

The radio section 120 transmits and receives various data such as encoded voice data to/from a base station through an antenna 128. The voice processing section 121 outputs the data which are input from the radio section 120 to the amplifier 123 by decoding the data. Further, the voice processing section 121 outputs the data which are input from the amplifier 123 to the radio section 120 by encoding the data. The amplifier 123 delivers the signal between the voice processing section 121 and the voice input and output section 124, and appropriately amplifies the delivered signal to a predetermined level. The voice input and output section 124 includes the speaker, the microphone or the like, outputs sound according to the signal from the amplifier 123 to the outside, and receives the input of the sound from the outside.

Further, the switching section 122 connects the ring sound generator 126 to the amplifier 123 by command from the controller 114 according to a call or the like from the base station. The ring sound generator 126 outputs data of the ring sound to the switching section 122 by command from the controller 114 according to the call from the base station. That is, the controller 114 outputs the ring sound by the voice input and output section 124 by outputting the data of the ring sound to the amplifier 123 according to the call or the like from the base station.

The call control memory section 127 stores a program relating to incoming and outgoing call control of the communication. In addition, the phone number input section 125 includes, for example, number keys from 0 to 9 along with other keys, and is used for inputting the phone number of a call destination by pressing the number keys or the like.

The power supply section 115 includes, for example, a lithium-ion secondary battery and supplies power to each section of the portable information apparatus 110. The voltage detecting section 116 detects the voltage which is supplied from the power supply section 115 to each section of the portable information apparatus 110. If the detected voltage is a predetermined value or less, the voltage detecting section 116 notifies the controller 114 that the voltage is the predetermined value or less. The predetermined voltage value is a value that is set in advance as a voltage required to stably operate the communication section 113 and, for example, is approximately 3 V. The controller 114 which receives the voltage drop notification from the voltage detecting section 116 prohibits or restricts operation of at least a part of a plurality of function sections including the radio section 120, the voice processing section 121, the switching section 122 and the ring sound generator 126. In this case, the controller 114 prohibits or restricts the operation of a function section of a plurality of function sections, in which power consumption is relatively large, earlier than a function section of the plurality of function sections, in which power consumption is relatively small. The controller 114 displays information indicating that the function is stopped or restricted due to the decrease in the power supply on the display section 112. The display may include characters, may include symbols, and, for example, may be also in a manner that a x (cross) mark is put on a phone icon displayed in the display section 112. The power shutdown section 117 selectively stops the power supply to the function section of the plurality of function sections, in which the function stops due to the voltage drop.

In the electronic apparatus of the embodiment such as the portable information apparatus 110 described above, it is possible to realize a stable operation with low power consumption by including the piezoelectric vibrator 1 according to the embodiment.

Next, a radio controlled timepiece is described. The radio controlled timepiece has functions for matching time to be displayed with time obtained from a standard radio wave. The standard radio wave is obtained by applying AM modulation on a carrier wave of a predetermined frequency by a modulation signal including the time information which is referred to as a time code. For example, the standard radio wave is transmitted from a transmitting station in Fukushima and a transmitting station in Saga, in Japan. In the standard radio wave transmitted from the transmitting station in Fukushima, the frequency of the carrier wave is 40 kHz and in the standard radio wave transmitted from the transmitting station in Saga, the frequency of the carrier wave is 60 kHz.

Figure 16:
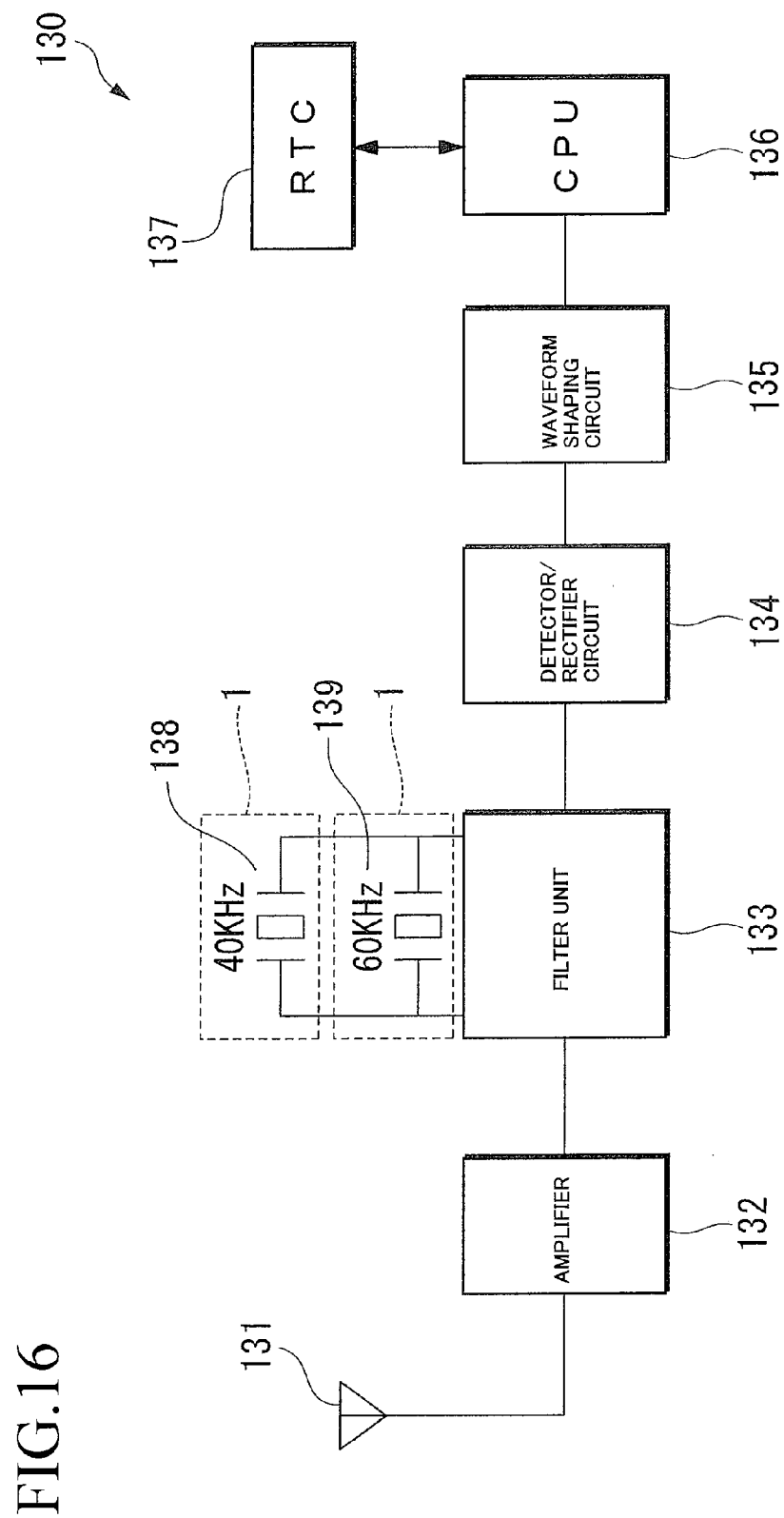
FIG. 16 is a view illustrating a radio controlled timepiece of an embodiment.

FIG. 16 is a view illustrating a radio controlled timepiece 130 of an embodiment. The radio controlled timepiece 130 includes an antenna 131, an amplifier 132, a filter section 133, a detection and rectification circuit 134, a waveform shaping circuit 135, a CPU 136 and an RTC 137.

The antenna 131 receives the standard radio wave. The amplifier 132 amplifies the signal of the standard radio wave received in the antenna 131 and then outputs the signal to the filter section 133. The filter section 133 filters and synchronizes the signal from the amplifier 132, and then outputs the signal to the detection and rectification circuit 134. The detection and rectification circuit 134 detects and demodulates the signal from the filter section 133, and then outputs the signal to the waveform shaping circuit 135. The waveform shaping circuit 135 acquires the time code from the signal from the detection and rectification circuit 134, and supplies the time code to the CPU 136. The CPU 136 acquires information regarding time such as the current year, the number of days, the day of the week, and time from the time code. The RTC 137 is a so-called real-time clock and holds information of the current year, month, day, hour, minute, second or the like. The CPU 136 reflects the information regarding the time acquired from the time code to the information which is held in the RTC 137. The information which is held in the RTC 137 is appropriately read and then is used for displaying the time.

The filter section 133 includes the piezoelectric vibrator of a resonance frequency corresponding to the frequency of the signal which is filtered. In the filter section 133, the piezoelectric vibrator functions as a resonator. For example, it is assumed that the radio controlled timepiece 130 of FIG. 16 is intended for use in Japan, and the filter section 133 includes a piezoelectric vibrator 1$a$ in which the resonance frequency is 40 kHz and a piezoelectric vibrator 1$b$ in which the resonance frequency is 60 kHz. Further, in the radio controlled timepiece 130 which is assumed to be used in areas outside Japan, the resonance frequency of the piezoelectric vibrator of the filter section 133 is set depending on the frequency of the carrier wave of the standard radio wave corresponding to the area where the radio controlled timepiece 130 is used.

In the embodiment, the piezoelectric vibrator 1$a$ and the piezoelectric vibrator 1$b$ of the filter section 133 are the piezoelectric vibrators of the embodiment described with reference to FIG. 1, respectively. Since the radio controlled timepiece 130 of the embodiment includes the piezoelectric vibrator 1 according to the embodiment, it is possible to realize a stable operation with low power consumption.

Moreover, a technical scope of the invention is not limited to the embodiments and the modification examples described above. For example, one or more elements described in the embodiments or the modification examples described above may be omitted. Further, the elements described in the embodiments or the modification examples described above may be appropriately combined.

Moreover, in the embodiments described above, the piezoelectric vibrator 1 is the piezoelectric vibrator of the ceramic package type but may be a so-called piezoelectric vibrator of a glass package type. Further, the base substrate is configured of two substrates of the first base substrate 10 and the second base substrate 11 but the base substrate may be configured of one substrate.

Moreover, in the embodiments described above, in the package body 4, the concave section forming the cavity C is formed by bonding the seal ring 12 to the base substrate but the concave section may be formed in the base substrate instead of using the seal ring 12.

What is claimed is:
1. A piezoelectric vibrating piece comprising:
 a pair of vibrating arm sections each having a groove section and a base end and a leading end, respectively;
 a base section between the pair of vibrating arm sections; and
 a connecting section that connects each base end of the pair of vibrating arm sections and the base section,
 wherein a length from the base end to the leading end of the vibrating arm section in a longitudinal direction of the vibrating arm section is Lv, and a length from the base end of the vibrating arm section to an opposite side of the connecting section opposite to the vibrating arm section is Lc, and wherein a ratio of Lc/Lv is greater than or equal to 0.1.

2. The piezoelectric vibrating piece according to claim 1, wherein the connecting section has a convex section protruding from the opposite side of the connecting section, and wherein the convex section includes an end of the connecting section opposite to the vibrating arm section in the longitudinal direction of the vibrating arm section.

3. The piezoelectric vibrating piece according to claim 1, further comprising mount electrodes that mount the piezoelectric vibrating piece to a substrate the mount electrodes in the base section and the connecting section, respectively.

4. A piezoelectric vibrator comprising:
the piezoelectric vibrating piece according to claim 1;
a base member on which the piezoelectric vibrating piece is mounted; and
a lid member defining a cavity with the base member that encloses the piezoelectric vibrating piece.

5. An oscillator comprising:
the piezoelectric vibrator according to claim 4; and
an integrated circuit electrically connected to the piezoelectric vibrator.

6. An electronic apparatus comprising a timer section including the piezoelectric vibrator according to claim 4.

7. A radio controlled timepiece comprising a filter section including the piezoelectric vibrator according to claim 4.

8. The piezoelectric vibrating piece according to claim 2, wherein the convex section comprises two separate portions protruding from the opposite side of the connecting section.

* * * * *